US012355024B2

(12) United States Patent
Chern et al.

(10) Patent No.: US 12,355,024 B2
(45) Date of Patent: Jul. 8, 2025

(54) HETEROGENOUS INTEGRATION SCHEME FOR III-V/Si AND Si CMOS INTEGRATED CIRCUITS

(71) Applicant: Taiwan Semiconductor Manufacturing Co., Ltd., Hsinchu (TW)

(72) Inventors: Chan-Hong Chern, Palo Alto, CA (US); Yi-An Lai, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 251 days.

(21) Appl. No.: 17/650,758

(22) Filed: Feb. 11, 2022

(65) Prior Publication Data

US 2023/0154912 A1 May 18, 2023

Related U.S. Application Data

(60) Provisional application No. 63/264,205, filed on Nov. 17, 2021.

(51) Int. Cl.
*H01L 25/065* (2023.01)
*H01L 21/768* (2006.01)
(Continued)

(52) U.S. Cl.
CPC ........ *H01L 25/50* (2013.01); *H01L 21/76898* (2013.01); *H01L 24/16* (2013.01);
(Continued)

(58) Field of Classification Search
CPC ............... H01L 25/50; H01L 21/76898; H01L 25/0657
See application file for complete search history.

(56) References Cited

U.S. PATENT DOCUMENTS 5,919,329 A * 7/1999 Banks .................. H01L 21/563
257/E21.503
8,212,294 B2 7/2012 Hoke et al.
(Continued)

FOREIGN PATENT DOCUMENTS

JP 2010114350 A 5/2010
JP 2013518441 A 5/2013
(Continued)

OTHER PUBLICATIONS

Ren, et al., "Hydrogen-terminated diamond FET and GaN HEMT delivering CMOS inverter operation at high-temperature," 2020 Device Research Converence, Colubus, OH, Jun. 21-24, 2020, 2 pages.

*Primary Examiner* — Dale E Page
*Assistant Examiner* — Wilner Jean Baptiste
(74) *Attorney, Agent, or Firm* — Slater Matsil, LLP

(57) ABSTRACT

A method includes bonding a III-V die directly to a Complementary Metal-Oxide-Semiconductor (CMOS) die to form a die stack. The III-V die includes a (111) semiconductor substrate, and a first circuit including a III-V based n-type transistor formed at a surface of the (111) semiconductor substrate. The CMOS die includes a (100) semiconductor substrate, and a second circuit including an n-type transistor and a p-type transistor on the (100) semiconductor substrate. The first circuit is electrically connected to the second circuit.

20 Claims, 32 Drawing Sheets

(51) Int. Cl.
*H01L 23/00* (2006.01)
*H01L 25/00* (2006.01)

(52) U.S. Cl.
CPC .............. *H01L 24/32* (2013.01); *H01L 24/33* (2013.01); *H01L 24/73* (2013.01); *H01L 24/81* (2013.01); *H01L 24/83* (2013.01); *H01L 25/0657* (2013.01); *H01L 2224/16146* (2013.01); *H01L 2224/32145* (2013.01); *H01L 2224/32245* (2013.01); *H01L 2224/33181* (2013.01); *H01L 2224/73204* (2013.01); *H01L 2224/83047* (2013.01); *H01L 2225/06513* (2013.01); *H01L 2225/06541* (2013.01); *H01L 2924/1425* (2013.01)

(56) References Cited

U.S. PATENT DOCUMENTS

| | | | |
|---|---|---|---|
| 8,536,629 | B2 | 9/2013 | Tada et al. |
| 8,724,355 | B1 | 5/2014 | Pinkhasov et al. |
| 10,483,249 | B2 | 11/2019 | Gardner et al. |
| 10,629,512 | B2 | 4/2020 | Pan et al. |
| 10,763,248 | B2 | 9/2020 | Dasgupta et al. |
| 2006/0030104 | A1* | 2/2006 | Doczy ............... H01L 21/32134 257/E21.309 |
| 2012/0228713 | A1 | 9/2012 | Chen et al. |
| 2015/0171050 | A1* | 6/2015 | Chen ................... H01L 27/1464 257/784 |
| 2016/0043060 | A1 | 2/2016 | Kabe et al. |
| 2016/0380090 | A1* | 12/2016 | Roberts ................. H01L 23/528 257/76 |
| 2018/0005988 | A1* | 1/2018 | Deligianni ............ H01L 27/092 |
| 2018/0033773 | A1* | 2/2018 | Huang ................ H01L 25/0657 |
| 2020/0381398 | A1 | 12/2020 | Lan et al. |
| 2021/0175136 | A1 | 6/2021 | Flemming et al. |

FOREIGN PATENT DOCUMENTS

| | | | |
|---|---|---|---|
| JP | 2021530103 | A | 11/2021 |
| KR | 20120103396 | A | 9/2019 |
| TW | 201721807 | A | 6/2017 |
| TW | 20172938 | A | 8/2017 |
| WO | 2010098151 | A1 | 9/2010 |
| WO | 2014184988 | A1 | 11/2014 |

* cited by examiner

HETEROGENOUS INTEGRATION SCHEME FOR III-V/Si AND Si CMOS INTEGRATED CIRCUITS

PRIORITY CLAIM AND CROSS-REFERENCE

This application claims the benefit of the following provisionally filed U.S. Patent application: Application No. 63/264,205, filed on Nov. 17, 2021, and entitled "Heterogenous Integration Scheme for GaN/Si & Si CMOS Integrated Circuits and Forming Method Thereof," which application is hereby incorporated herein by reference.

BACKGROUND

Compared to Si based transistors, gallium nitride (GaN) n-type (N-channel) transistor has significantly superior performance in enabling high-performance, high power efficiency (e.g. Power added Efficiency (PAE)) applications including RF power amplifier, switch, low noise amplifier, which applications include 5G/6G RF networks and mobile devices. The GaN n-type transistors also have small form factor Nevertheless, p-type GaN transistors have much lower p-type mobility than the n-type GaN transistors, partly due to hole band structure. It is thus impractical to manufacture high-voltage GaN Complimentary device circuits.

Si Complementarity Metal-oxide-semiconductor (CMOS) circuits (including NMOS & PMOS devices) have excellent transistor characteristics for lower power consumption and high-density logic & compute circuits, and are suitable for complicated analog/mixed-signal circuits. The power amplifiers built through silicon CMOS technology, however, have very low power-efficiency, such as PAE.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
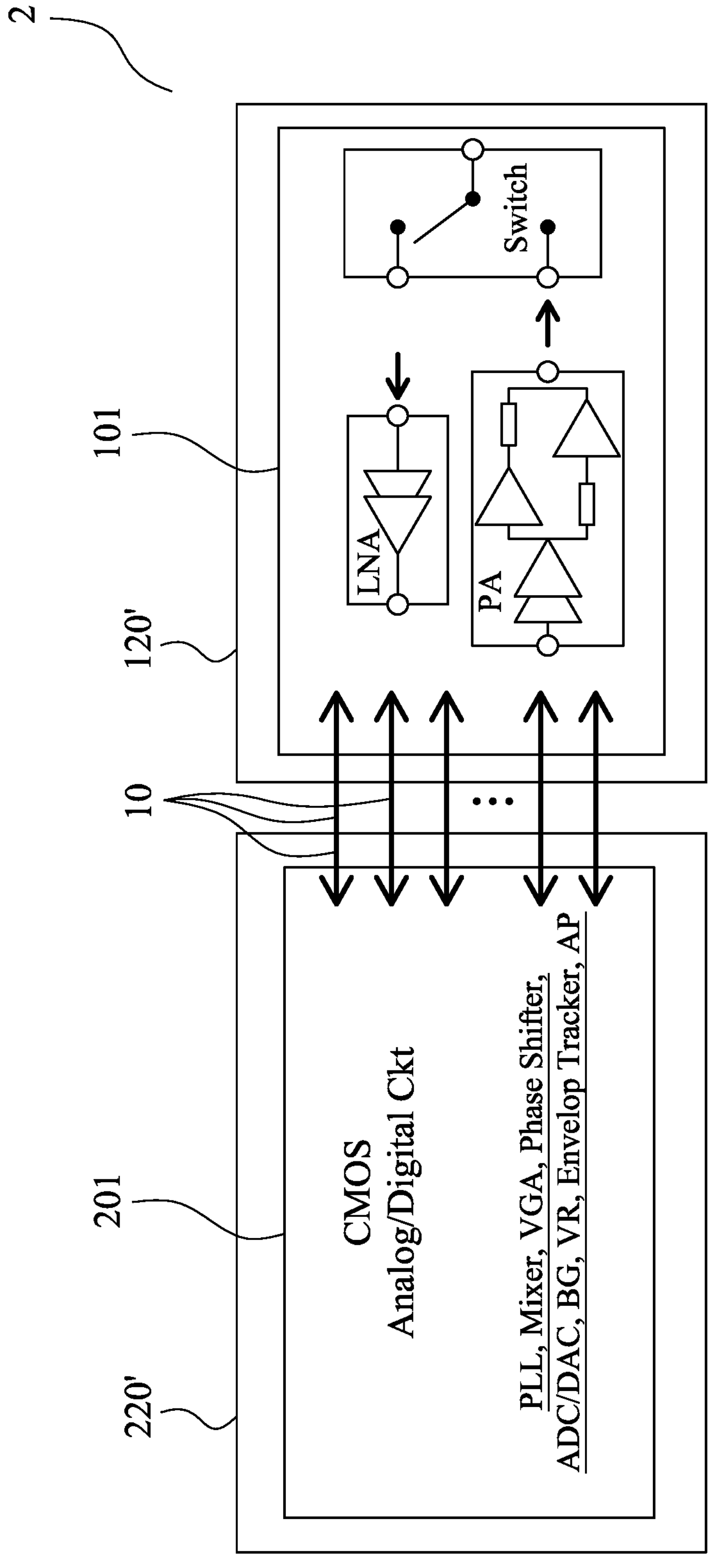
FIG. 1 illustrates a schematic block diagram of circuits in a package including a III-V die and a CMOS die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages comprising a Complementary Metal-Oxide-Semiconductor (CMOS) based device die (referred to as CMOS die hereinafter) and a III-V-based device die (referred to as III-V die hereinafter) and the method of forming the same are provided. In accordance with some embodiments of the present disclosure, III-V n-type transistors are formed on first device die including a (111) substrate. The III-V die may be free from p-type devices. The III-V n-type transistors are suitable for high voltages. Both of p-type and n-type transistors are formed in the CMOS die including a (100) substrate, and the p-type and n-type transistors are suitable for low voltages. The III-V die and the CMOS die are stacked to reduce the length of the interconnection from the III-V die to the CMOS die. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a schematic block diagram of circuits in a package 2 in accordance with some embodiments. The circuits include portions formed in a first device die 120' and portions formed in a second device die 220'. The first device die 120' includes devices formed based on III-V semiconductor materials, and hence is alternatively referred to as a III-V die 120' hereinafter. The second device die 220' includes CMOS-based devices such as both of p-type and n-type transistors, which may have channels formed of silicon, silicon germanium, and/or the like. In accordance with some embodiments, device die 220' is free from III-V semiconductor-based devices. Device die 220' is alternatively referred to as CMOS die 220' hereinafter.

In accordance with some embodiments, III-V die 120' may include Radio Frequency (RF) Front End Module (FEM) 101. The corresponding circuits may include front-end circuits such as Power Amplifiers (PAS), switches, Low-Noise Amplifier (LNAs), or the like, or combinations thereof. III-V die 120' may also include portions (such as the n-type transistors) of some of control circuits, which may be used for controlling the front-end circuits. The circuits in III-V die 120' are III-V based devices, as will be discussed in subsequent paragraphs, which may endure medium and high power supply voltages, and may be operated under high power supply voltages, for example, higher than about 3.5 volts, 12 volts, or the like.

The CMOS die 220' may include logic/core circuits 201, which may include the controllers for controlling the front-end circuits in III-V die 120'. The example circuits 201 in CMOS die 220' may include, and are not limited to, a Phase Lock Loop (PLL), a mixer, a Variable Gain Amplifier (VGA), a phase shifter, an Analog-to-Digital Converter/Digital-to-Analog Converter (ADC/DAC), a Bandgap Reference (BG) circuit, a Voltage Regulator (VR), an envelope tracker, an Application Processor (AP), or the like, or combinations thereof. The circuits in CMOS die 220' may include non-III-V comprising circuits, for example, having silicon, silicon germanium, germanium, or the like as the channels of the corresponding transistors. The devices and circuits in CMOS die 220' are operated under low power supply voltages (for example, lower than about 1.5 volts) lower than the power supply voltages of III-V die 120', and hence are low-voltage devices and circuits.

A plurality of interconnections 10, which may include micro bumps (U-bumps), solder region, bond pads (such as in hybrid bonding structures), or the like, are formed to interconnect the circuits in III-V die 120' and CMOS die 220' to form a system. For example, the interconnections 10 may include the interconnections for coupling an input of a power amplifier in III-V die 120' to an output in CMOS die 220', A switch in III-V die 120' may be connected to (through interconnections 10) and controlled by control signals from CMOS die 220', and the switch may be used to electrically and signally couple a PA or an LNA to an antenna (not shown). An LNA's output may also be coupled to an input of the CMOS die 220' through interconnections 10.

Figure 2:
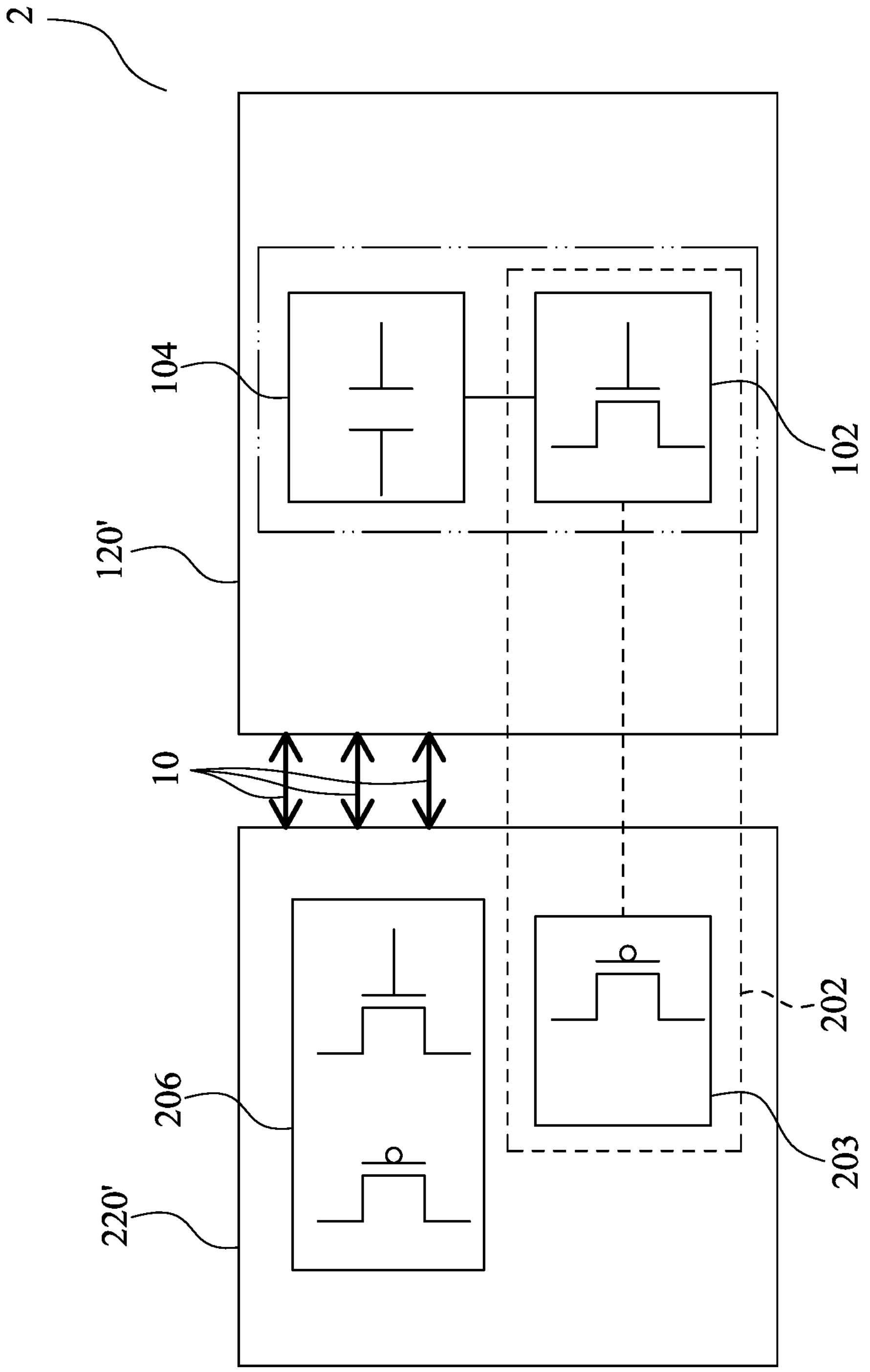
FIG. 2 illustrates a schematic block diagram of circuits and the corresponding p-type and n-type transistors in a package including a III-V die and a CMOS die in accordance with some embodiments.

FIG. 2 illustrates a block diagram of package 2 from the point of view of circuits and the corresponding p-type and n-type transistors. In accordance with some embodiments, device die 120' includes a (111) substrate, and device die 220' includes a (100) substrate. III-V based n-type transistors 102 are formed in III-V die 120', so that the transistors 102 have high mobility and low parasitic capacitance. It is advantageous to form the high-voltage n-type transistors in III-V die 120' rather than CMOS die 220'. For example, CMOS transistors prefer (100) substrates due to the high mobility. Conversely, the n-type III-V transistors prefer (111) substrates, and would have high number of defects when formed on the (100) transistors.

Since p-type III-V transistors have very low efficiency, III-V die 120' may be free from p-type devices. In accordance with some embodiments, some of the functions of the p-type devices in the circuits in III-V die 120' may be achieved by passive devices 104 (which may include capacitors, resistors, inductors, or the like) formed in III-V die 120' to replace p-type transistor. For example, the circuits using the passive devices 104 may include inverters, AND gates, OR gates, XOR gates, or the like. In accordance with some embodiments, some p-type transistors 203 are formed in CMOS die 220', and are directly connected to (without active and passive devices in between) the n-type transistors 102 in III-V die 120' to form functional circuits 202. The functional circuits 202 may be low-voltage circuits such as some controller, and may include inverters, AND gates, OR gates, XOR gates, or the like, or more complex circuits. For example, an inverter may include an n-type transistor as a pull-down device, and a p-type transistor as a pull-up device, wherein the n-type transistor 102 is in III-V die 120', and the p-type transistor 203 is in CMOS die 220'. The embodiments of the present disclosure make this type of connection scheme possible.

The CMOS die 220' further includes both of n-type and p-type transistors 206, which may be used for forming the circuits as discussed referring to FIG. 1. The connection (through interconnections 10) of III-V die 120' and CMOS die 220' are shown in the example embodiments in FIGS. 57, 58, and 60-63.

The formation processes for forming the circuits and the corresponding devices as shown in FIGS. 1 and 2 are shown in the subsequent Figures. FIGS. 3-45 illustrate the formation of example III-V wafers and dies 120'. FIGS. 46-53 illustrate the formation of example CMOS wafers and dies 220'. FIGS. 54-59 illustrate the process for bonding the III-V dies 120' and CMOS dies 220' to form packages.

Figure 3:
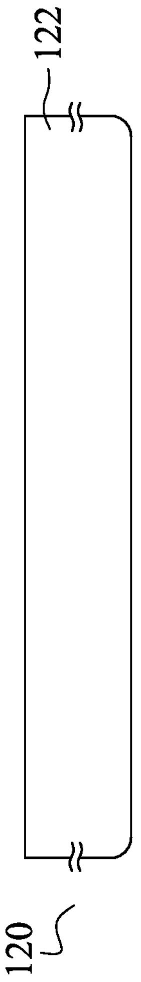
FIGS. 3-14 illustrate the cross-sectional views of intermediate stages in the formation of a III-V device die/wafer in accordance with some embodiments.
Figure 13:
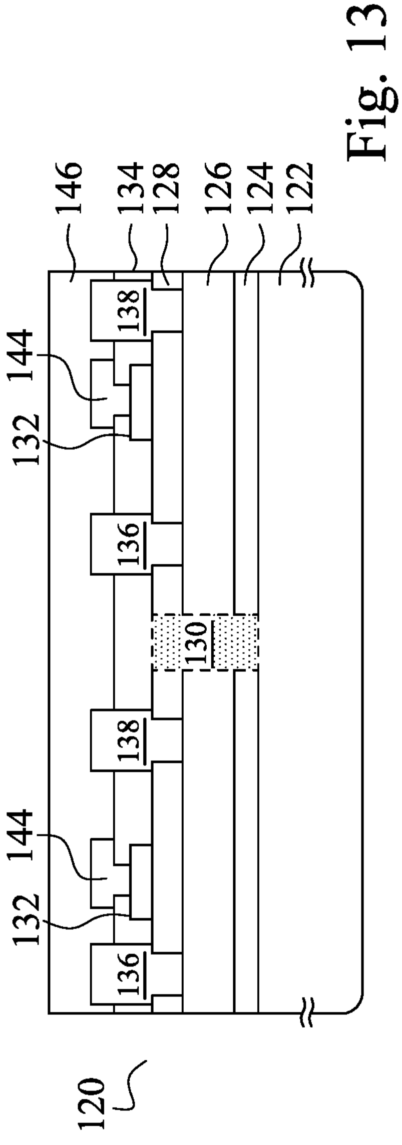
Figure 14:
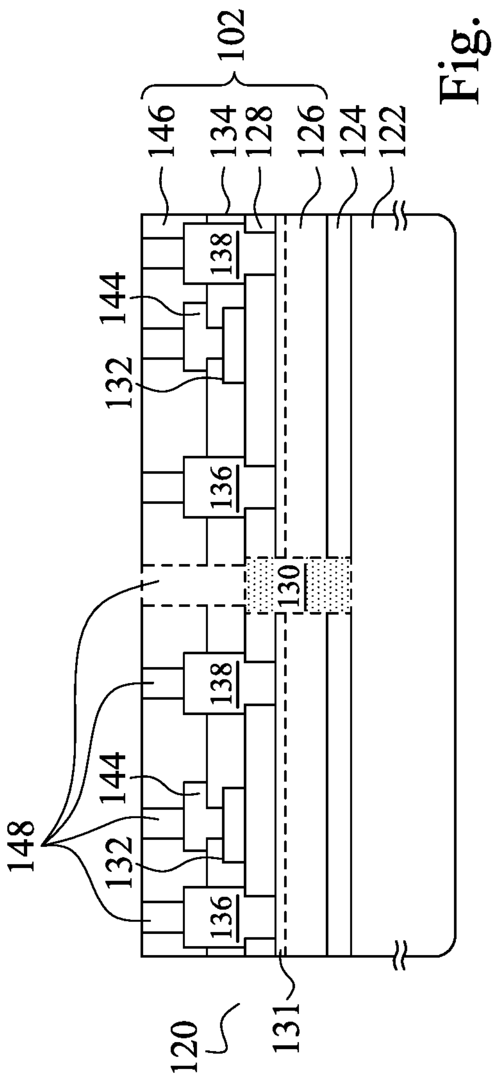
Figure 15:
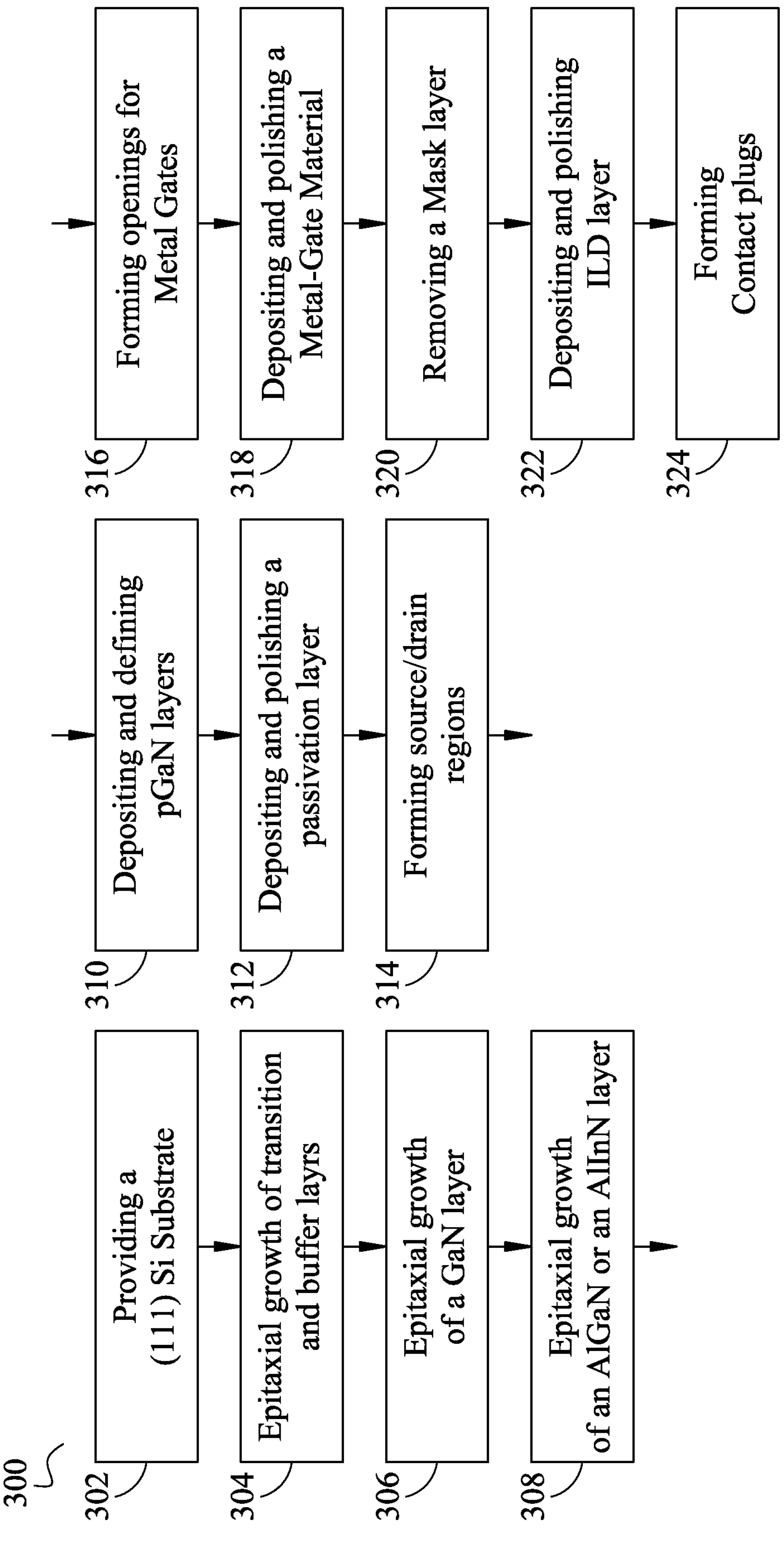
FIG. 15 illustrates a process flow of the processes in FIGS. 3-14 in accordance with some embodiments.

FIGS. 3-14 illustrate the cross-sectional views of intermediate stages in the formation of a III-V die and the corresponding n-type transistors in accordance with some embodiments. The n-type transistors are free from gate dielectrics in accordance with these embodiments. Referring to FIG. 3, wafer 120 is provided, which includes substrate 122 as a part. The respective process is illustrated as process 302 in the process 300 as shown in FIG. 15. In accordance with some embodiments, substrate 122 is a semiconductor substrate, which may include a silicon substrate, for example. Substrate 122 may be a bulk substrate formed of a bulk material, or may be a composite substrate including a plurality of layers that are formed of different materials. The surface of substrate 122 is on a (111) surface plane of silicon, and hence substrate 122 is referred to as a (111) substrate.

Figure 4:
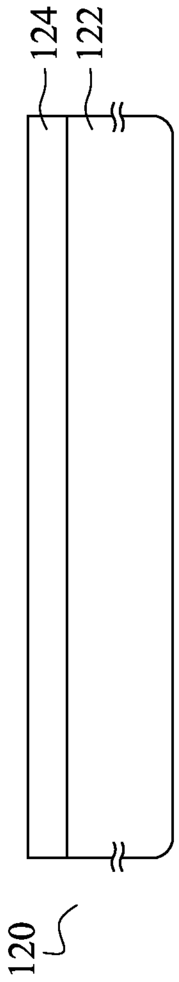

Referring to FIG. 4, buffer layer 124 is formed over substrate 122, which acts as the buffer and/or the transition layer for the subsequently formed overlying layers. The respective process is illustrated as process 304 in the process 300 as shown in FIG. 15. Buffer layer 124 may be epitaxially grown using Metal Organic Vapor Phase Epitaxy (MOVPE) or a like method. Buffer layer 124 may function as a buffer layer to reduce the lattice mismatch between substrate 122 and the subsequently formed III-V compound layers 126. Buffer layer 124 may include a single layer or a plurality of layers. In accordance with some embodiments, buffer layer 124 includes an AlN—GaN superlattice layer, an AlN—AlGaN superlattice layer, or a GaN—AlGaN superlattice layer.

Figure 5:
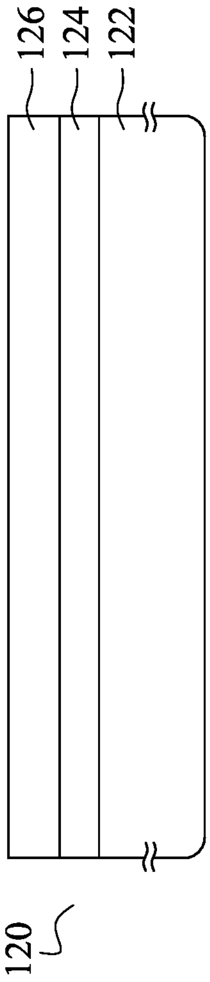

Referring to FIG. 5, III-V compound layer 126 is epitaxially grown over buffer layer 124. The respective process is illustrated as process 306 in the process 300 as shown in FIG. 15. In accordance with some embodiments, III-V compound layer 126 is a gallium nitride (GaN) layer. GaN layer 26 may be epitaxially grown by using, for example, MOVPE, during which a gallium-containing precursor and a nitrogen-containing precursor are used. III-V compound layer 126 may also include GaAs or InP rather than GaN, or may include a GaAs layer or an InP layer.

Figure 6:
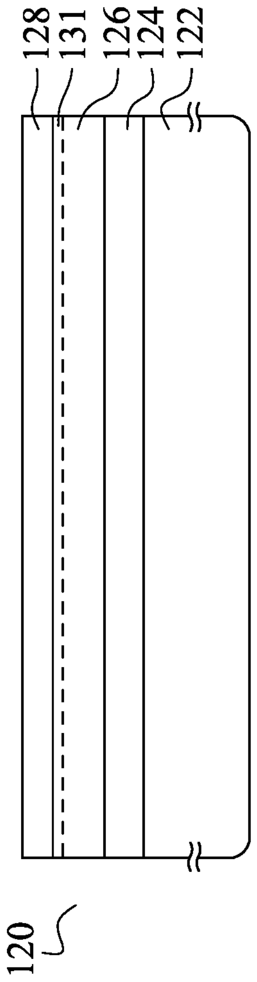

Referring to FIG. 6, III-V compound layer 128 is formed over, and may contact, III-V compound layer 126. The respective process is illustrated as process 308 in the process 300 as shown in FIG. 15. The example material of III-V compound layer 128 may include AlGaN, AlInN, InGaN, or the like, or combinations thereof. III-V compound layer 128 may be epitaxially grown by using, for example, MOVPE. A carrier channel 131, which is also referred to as a Two-Dimensional Electron Gas (2DEG), is formed and located near the interface between III-V compound layers 126 and 128, and may be in III-V compound layer 126.

Figure 7:
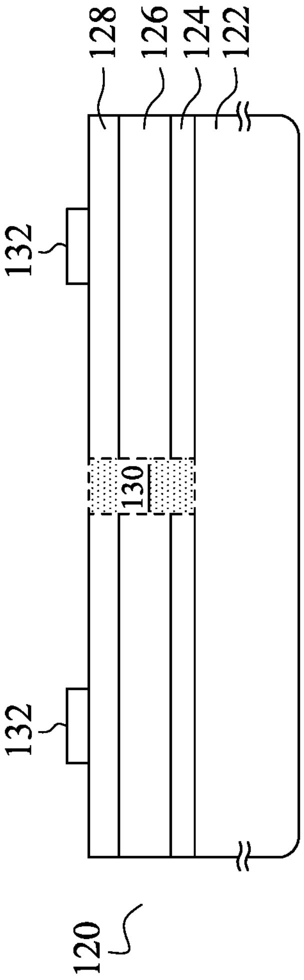
Figure 8:
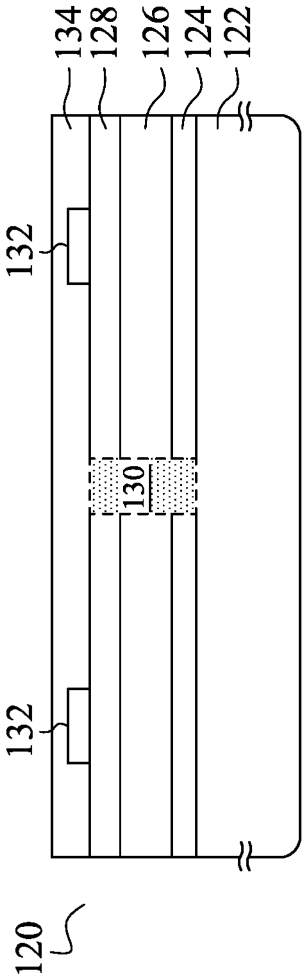

In accordance with some embodiments, as shown in FIG. 7, Through-GaN Via (TGV) 130 is formed. TGV 130 may be formed using a metallic material, which may be formed of or comprise tungsten, cobalt, nickel, or the like, or alloys thereof. The formation process may include etching III-V compound layers 124, 126, and 128 to form an opening and to expose substrate 122. The opening is then filled with the metallic material, followed by a planarization process such as a Chemical Mechanical Polish (CMP) process or a mechanical grinding process to remove excess metallic material, leaving TGV 130. TGV 130 may have two functions. Some of TGVs 130 may be formed proximate the edges of the respective dies in III-V wafer 120, and surrounding the inner regions of the dies. These TGVs have the function of stopping the cracking and delamination of III-V compound layers, which cracking and delamination may occur during the die-saw of wafer 120. Some other TGVs 130 may be formed as electrical connections to connect substrate 122 to an overlying connection (as shown in FIG. 14). These TGVs may be encircled by oxide implantation regions (not shown), which are formed by implanting oxygen into the portions of III-V compound layers 124, 126, and 128 surrounding the corresponding TGVs, and oxidizing the implanted regions through annealing, so that these TGVs 130 are electrically isolated from the adjacent portions of III-V compound layers 124, 126, and 128. In accordance with alternative embodiments, TGVs 130 are not formed. Accordingly, the TGV 130 is shown as being dashed to indicate that it may or may not be formed.

Further referring to FIG. 7, p-type GaN layers 132 are formed over and contacting III-V compound layer 128. The respective process is illustrated as process 310 in the process 300 as shown in FIG. 15. In accordance with some embodiments, p-type GaN layers 132 are formed by depositing and then patterning a p-type GaN layer, which may be doped with magnesium to be p-type.

Next, passivation layer 134 is deposited over, and may contact, a top surface of p-type GaN layers 132 and III-V compound layer 128. The respective process is illustrated as process 312 in the process 300 as shown in FIG. 15. An example passivation layer 134 includes a dielectric material such as silicon oxide and/or silicon nitride. Passivation layer 134 protects the underlying III-V compound layer 128 from the damage from plasma, which plasma is generated in subsequent deposition processes.

Figure 9:
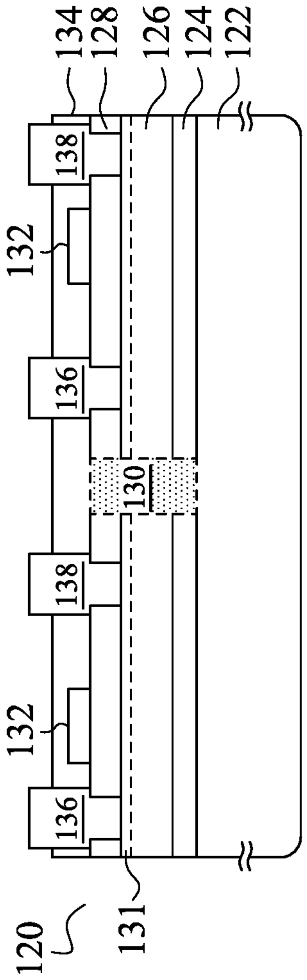

FIG. 9 illustrates a cross-sectional view of wafer 120 after source regions 136 and drain regions 138 are formed. The respective process is illustrated as process 314 in the process 300 as shown in FIG. 15. To form source regions 136 and drain regions 138, a mask layer (not shown) is first formed over passivation layer 134. Two openings are formed by etching the mask layer, passivation layer 134, and III-V compound layer 128. The portions of III-V compound layer 126 on opposite sides of p-type GaN layers 132 are thus exposed. In accordance with some embodiments, a metal layer is formed through deposition to fill the openings, followed by a planarization process to remove excess portions of the metal layer over the mask layer. The remaining portions of the metal layer are source regions 136 and drain regions 138. The mask layer is then removed, leaving source regions 136 and drain regions 138, which are interconnected through carrier channel 131 through ohmic contact.

In accordance with some embodiments, source regions 136 and drain regions 138 include one or more conductive materials. For example, source regions 136 and drain regions 138 may comprise Ti, Co, Ni, W, Pt, Ta, Pd, Mo, TiN, an AlCu alloy, or alloys thereof.

Figure 10:
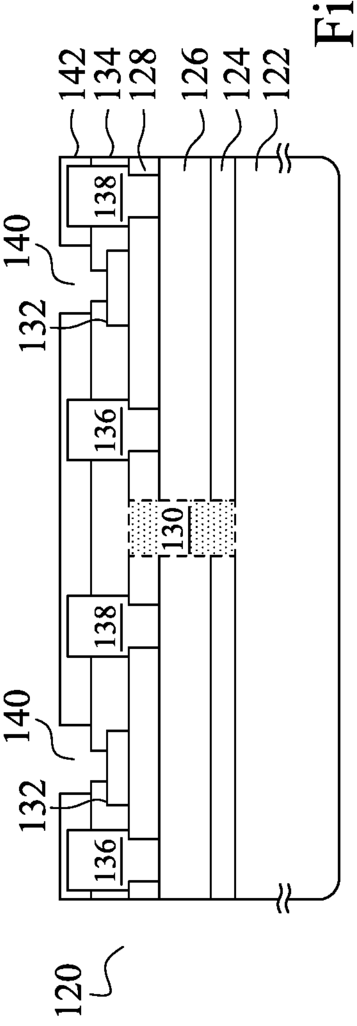
Figure 11:
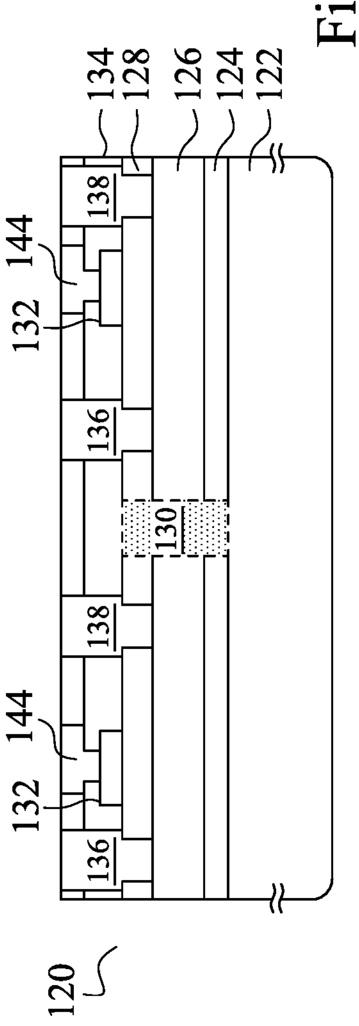
Figure 12:
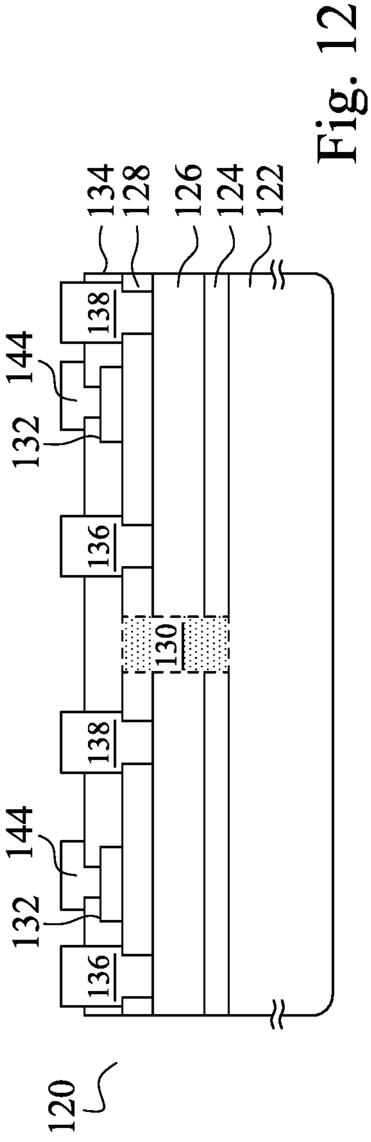

Referring to FIG. 10, mask layer 142 is formed, which may be a hard mask such as SiN, TiN, or the like. Openings 140 are formed in mask layer 142 and passivation layer 134 to expose p-type GaN layers 132. The respective process is illustrated as process 316 in the process 300 as shown in FIG. 15. Next, as shown in FIG. 11, metal gates 144 are formed to fill openings 140. The respective process is illustrated as process 318 in the process 300 as shown in FIG. 15. The formation process may include a deposition process followed by a planarization process. Metal gates 144 may be formed of or comprise tungsten, copper, cobalt, nickel, or the like, or alloys thereof. Mask layer 142 is then removed, and the resulting structure is shown in FIG. 12. The respective process is illustrated as process 320 in the process 300 as shown in FIG. 15.

Referring to FIG. 13, Inter-Layer Dielectric (ILD) 146 is deposited. The respective process is illustrated as process 322 in the process 300 as shown in FIG. 15. Before the deposition of ILD 146, a Contact Etch Stop layer (CESL, not shown) may also be deposited as a conformal layer.

FIG. 14 illustrates the formation of contact plugs 148, which are connected to source regions 136 and drain regions 138, and metal gates 144. The respective process is illustrated as process 324 in the process 300 as shown in FIG. 15. When TGV 130 is formed, one of contact plugs 148 is formed over and connected to TGV 130.

In the above-described embodiments, p-type GaN layer 132, source regions 136 and drain regions 138, and carrier channel 131 collectively form n-type transistors 102, which is shown schematically in FIG. 2. Wafer 120 may be free from p-type transistors. The n-type transistors 102 as shown in FIG. 14 are free from gate dielectrics. When a voltage is applied to a p-type GaN layer 132, a device current flowing through carrier channel 131 and between source region 136 and drain region 138 may be modulated. For example, when no voltage, a negative voltage, or a low positive-voltage is applied on p-type GaN layer 132, the portion of carrier channel 131 directly underlying p-type GaN layer 132 is depleted, and the respective transistor 102 is turned off. When a positive voltage that is high enough is applied on p-type GaN layer 132, the depleted carrier channel 131 is restored and enhanced, the corresponding source region 136 and drain region 138 are connected through the restored carrier channel 131, and the respective transistor 102 is turned on.

Figure 27:
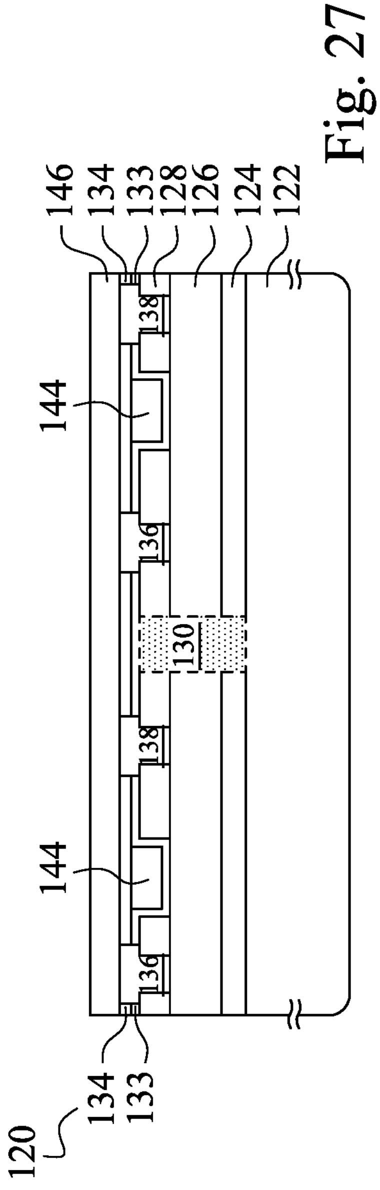
Figure 28:
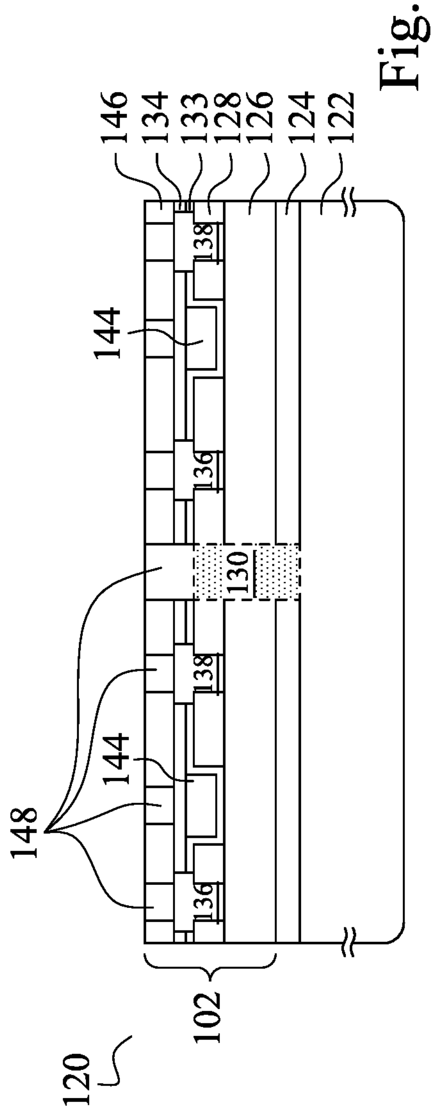

FIGS. 16-28 illustrate the cross-sectional views of intermediate stages in the formation of n-type transistors in accordance with alternative embodiments of the present disclosure. These embodiments are similar to the embodiments shown in FIGS. 3-14, except that the corresponding transistors now include gate dielectrics. Accordingly, the n-type transistors as shown in FIG. 28 may physically cut the carrier channels. Unless specified otherwise, the materials and the formation processes of the components in these embodiments are essentially the same as the like components denoted by like reference numerals in the preceding embodiments. The details regarding the formation process and the materials of the components shown in FIGS. 16 through 28 may thus be found in the discussion of the preceding embodiments.

Figure 16:
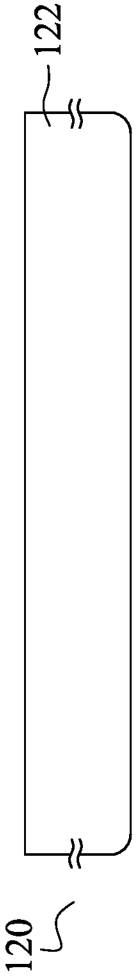
FIGS. 16-28 illustrate the cross-sectional views of intermediate stages in the formation of a III-V device die/wafer in accordance with some embodiments.
Figure 17:
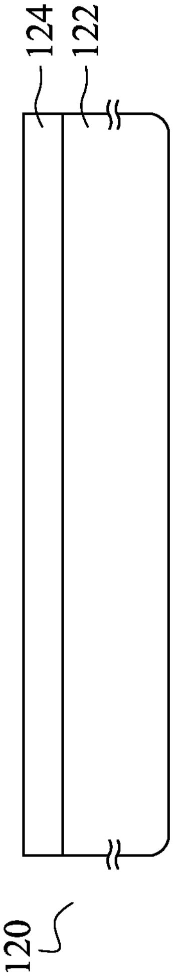
Figure 18:
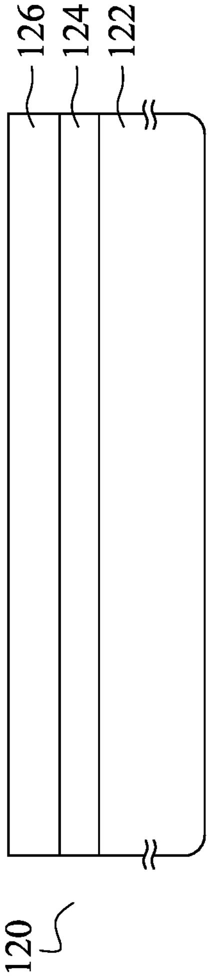
Figure 19:
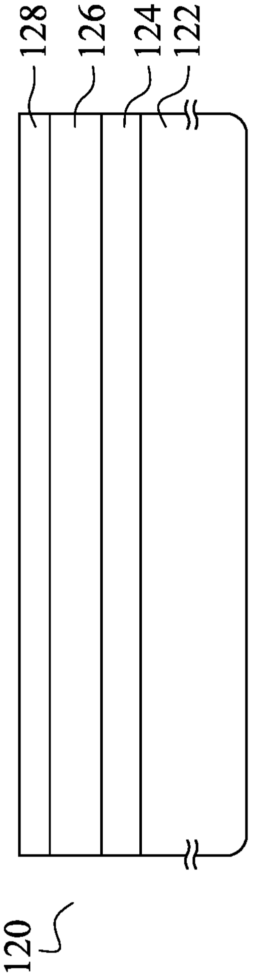
Figure 20:
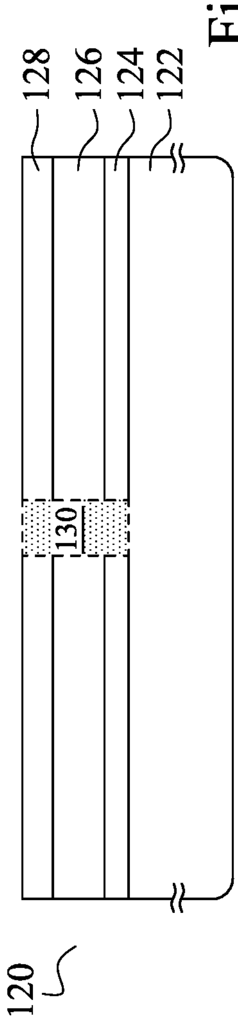
Figure 29:
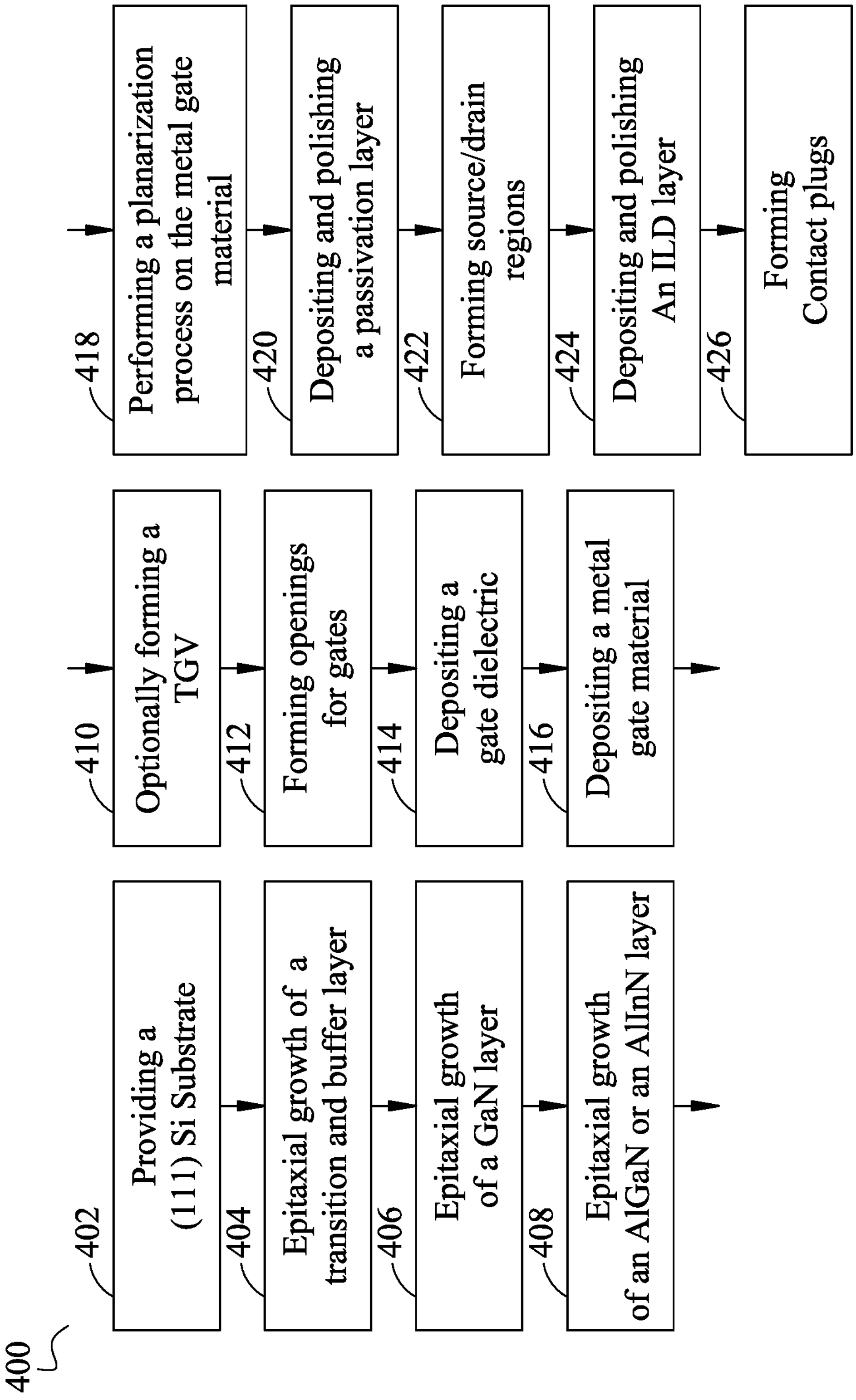
FIG. 29 illustrates a process flow of the processes in FIGS. 16-28 in accordance with some embodiments.

Referring to FIG. 16, wafer 120, which includes substrate 122, is provided. The respective process is illustrated as process 402 in the process 400 as shown in FIG. 29. The substrate 122 may be a (111) substrate, with the top surface of substrate 122 on a (111) plane of substrate 122. FIG. 17 illustrates the epitaxial growth of III-V compound layer 124, which is a buffer layer. The respective process is illustrated as process 404 in the process 400 as shown in FIG. 29. III-V compound layer 124 may be a superlattice layer. FIG. 18 illustrates the epitaxial growth of III-V compound layer 126, which may be a GaN layer in accordance with some embodiments. The respective process is illustrated as process 406 in the process 400 as shown in FIG. 29. FIG. 19 illustrates the epitaxial growth of III-V compound layer 128, which may be an AlGaN layer or an AlInN layer in accordance with some embodiments. The respective process is illustrated as process 408 in the process 400 as shown in FIG. 29. FIG. 20 illustrates the formation of TGV 130. The respective process is illustrated as process 410 in the process 400 as shown in FIG. 29. The formation of TGV 130 may also be skipped in accordance with alternative embodiments.

Figure 21:
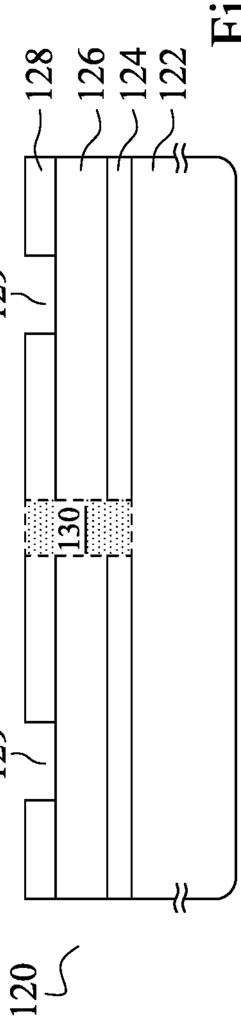

FIG. 21 illustrates an etching process for defining the openings of metal gates. The respective process is illustrated as process 412 in the process 400 as shown in FIG. 29. In the etching process, III-V compound layer 128 is etched to form openings 129, through which the underlying III-V compound layer 126 is exposed.

Figure 22:
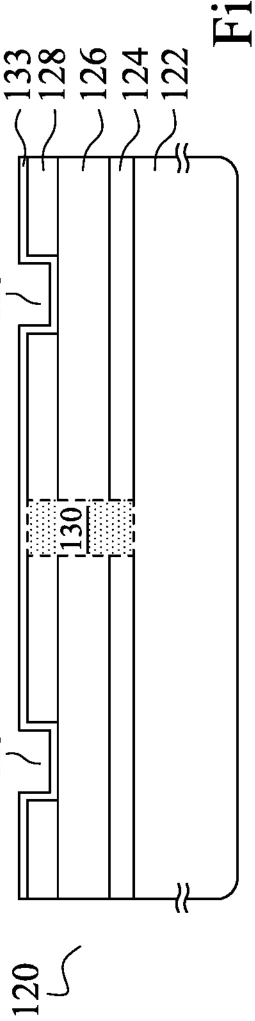

Referring to FIG. 22, gate dielectric layer 133 is deposited to extend into openings 129. The respective process is illustrated as process 414 in the process 400 as shown in FIG. 29. Gate dielectric layer 133 also includes a portion overlapping and contacting III-V compound layer 126. Gate dielectric layer 133 may increase the threshold voltage of the resulting transistor 102 (FIG. 28). The example materials of gate dielectric layer 133 may be selected from silicon oxide, silicon nitride, gallium oxide, aluminum oxide, scandium oxide, zirconium oxide, lanthanum oxide, hafnium oxide, and combinations thereof. In accordance with some embodiments, gate dielectric layer 133 is formed using Atomic Layer Deposition (ALD). In accordance with other embodiments, gate dielectric layer 133 is formed using Plasma Enhanced Chemical Vapor Deposition (PECVD) or Low-Pressure Chemical Vapor Deposition (LPCVD).

Figure 23:
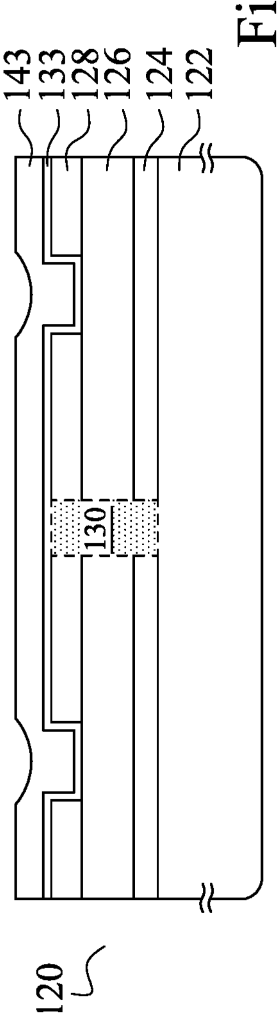
Figure 24:
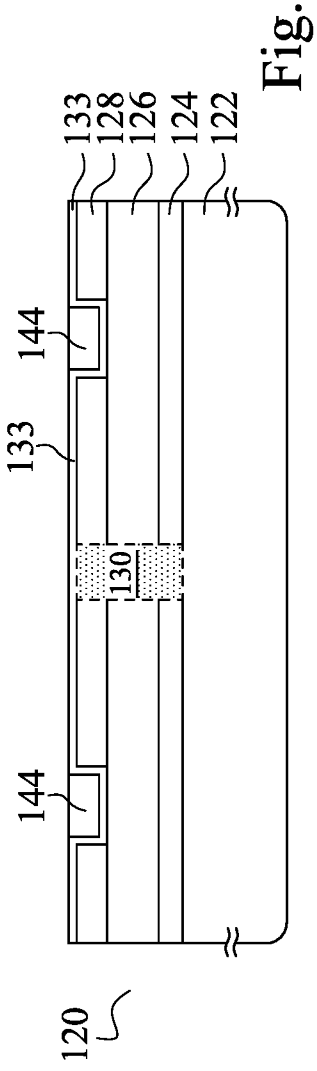

Referring FIG. 23, a metallic material 143 is deposited. The respective process is illustrated as process 416 in the process 400 as shown in FIG. 29. In accordance with some embodiments, metallic material 143 includes a conductive material that includes a refractory metal or the respective compound including Ti, TiN, W, TiW, Ni, Au, Cu, or the like, or the alloys thereof. FIG. 24 illustrates a planarization process (such as a CMP process) to remove excess portions of metallic material 143, forming metal gates 144. The respective process is illustrated as process 418 in the process 400 as shown in FIG. 29.

Figure 25:
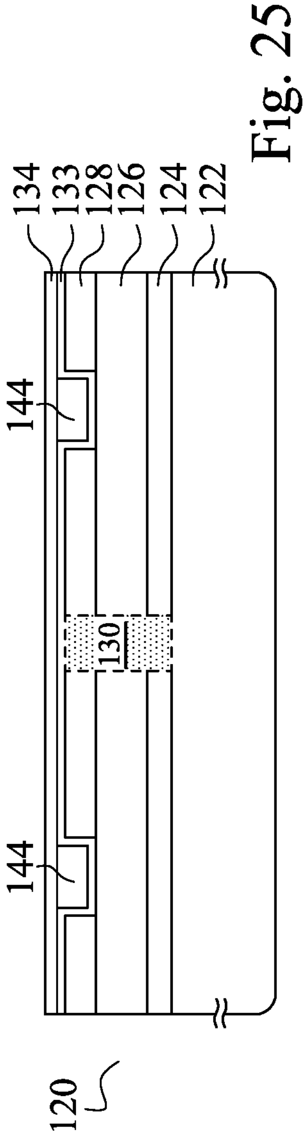
Figure 26:
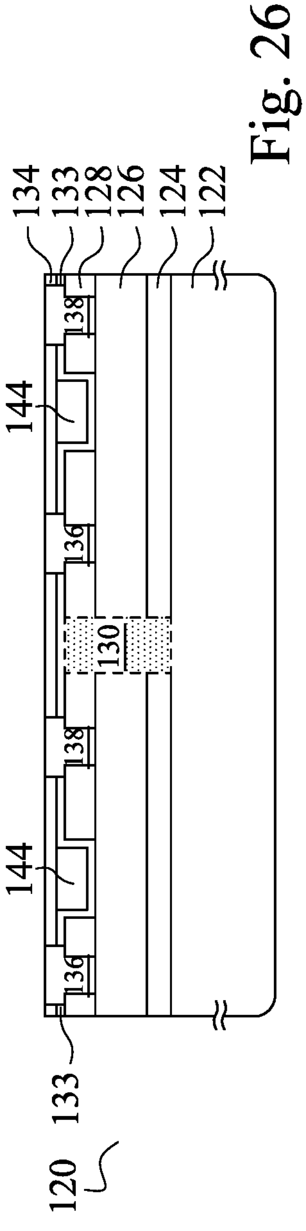

FIG. 25 illustrates the deposition of passivation layer 134. The respective process is illustrated as process 420 in the process 400 as shown in FIG. 29. FIG. 26 illustrates the formation of source region 136 and drain region 138. The respective process is illustrated as process 422 in the process 400 as shown in FIG. 29. FIG. 27 illustrates the deposition of ILD 146. The respective process is illustrated as process 424 in the process 400 as shown in FIG. 29. FIG. 28 illustrates the formation of contact plugs 148. The respective process is illustrated as process 426 in the process 400 as shown in FIG. 29. III-V based n-type transistors 102 are thus formed.

Figure 30:
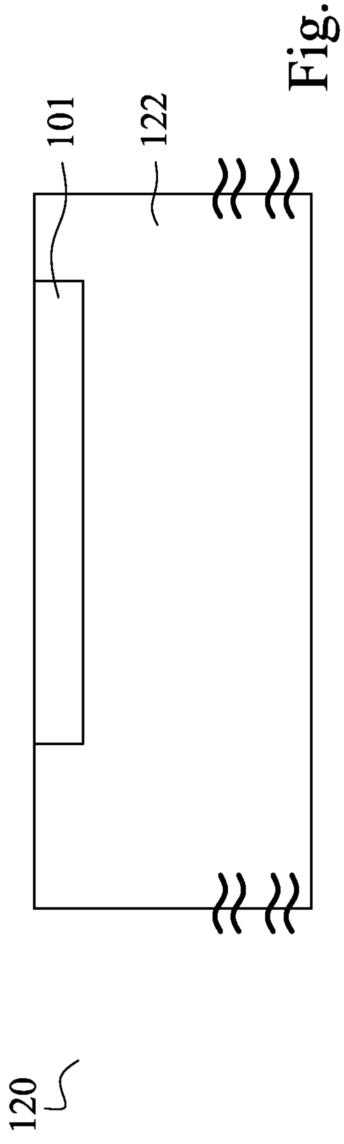
FIGS. 30-35 illustrate the cross-sectional views of intermediate stages in the formation of interconnect structures for a III-V device die/wafer in accordance with some embodiments.

FIGS. 30-35 illustrates the formation of interconnect structures and electrical connectors for III-V wafer 120. The respective process flow 500 is shown in FIG. 36. Referring to FIG. 30, circuits 101 are formed at the top surface of substrate 122. In accordance with some embodiments, circuits 101 include PAs, switches, LNAs, or the like, or combinations thereof, which have been discussed referring to FIG. 1. The respective process is illustrated as process 502 in the process 500 as shown in FIG. 36. Furthermore, the formation of circuits 101 includes the formation of III-V-based n-type transistors 102, which formation processes are as shown in FIGS. 3-29, and are shown in FIG. 2 also. Accordingly, FIGS. 30-35 illustrate the processes following the processes as shown in FIGS. 3-15 or FIGS. 16-29.

Figure 31:
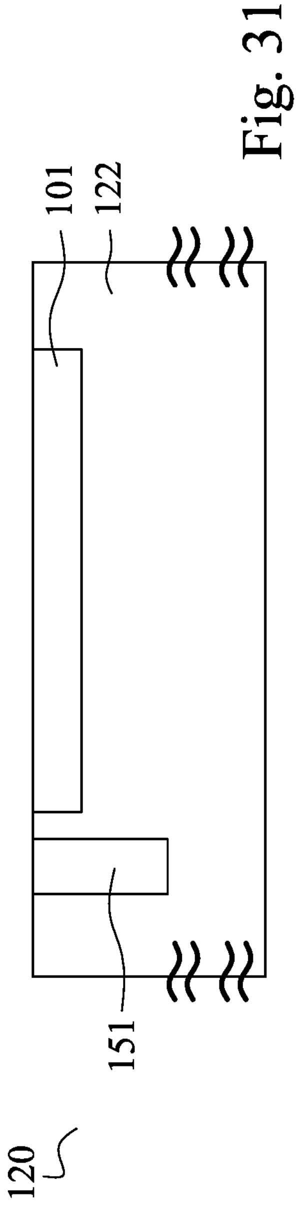

Referring to FIG. 31, Through-Substrate Via (or Through-Silicon via) 151 is formed. The respective process is illustrated as process 504 in the process 500 as shown in FIG. 36. The formation process may include etching substrate 122 to form an opening, lining the sidewalls of the opening with an isolation layer, filling the opening with a metallic material, and performing a planarization process to remove the excess metallic material. Although one TSV 151 is shown, there may be a plurality of TSVs 151 formed, which may be used for heat dissipation or electrical connection. The TSVs 151 used for heat dissipation may be formed wider than the TSVs 151 used for electrical connection, so that the heat-dissipation efficiency is improved.

Figure 32:
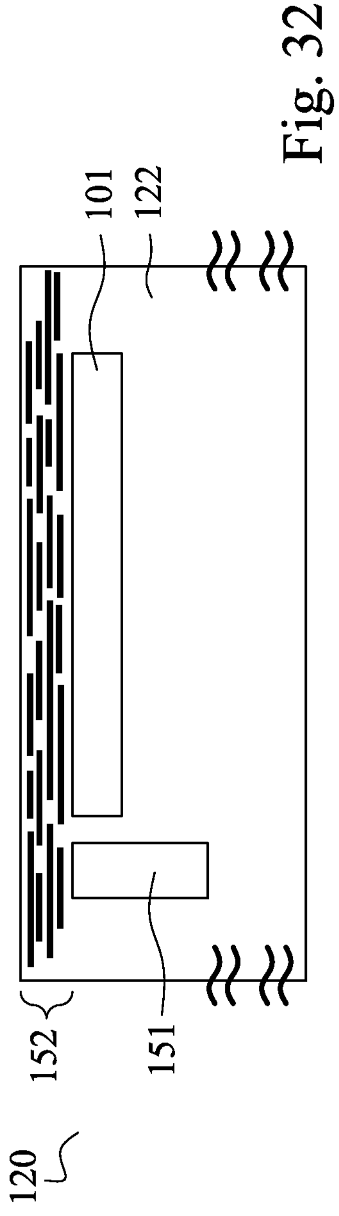

Referring to FIG. 32, interconnect structure 152 is formed. Interconnect structure 152 is also referred to as a Back-End of Line (BEOL) interconnect structure. The respective process is illustrated as process 506 in the process 500 as shown in FIG. 36. Interconnect structure 152 may also include passive devices formed therein, which devices are also shown as passive devices 104 in FIG. 2. Interconnect structure 152 may include dielectric layers, which may include Inter-Metal Dielectric (IMD) layers and overlying passivation layers. Interconnect structure 152 may further include conductive features including metal lines, vias, redistribution lines (RDLs), contact plugs, metal pads, Under-Bump Metallurgies (UBMs), and/or the like, which are schematically shown in FIG. 32. The conductive features are connected to, and interconnect the devices in, circuits 101.

Figure 33:
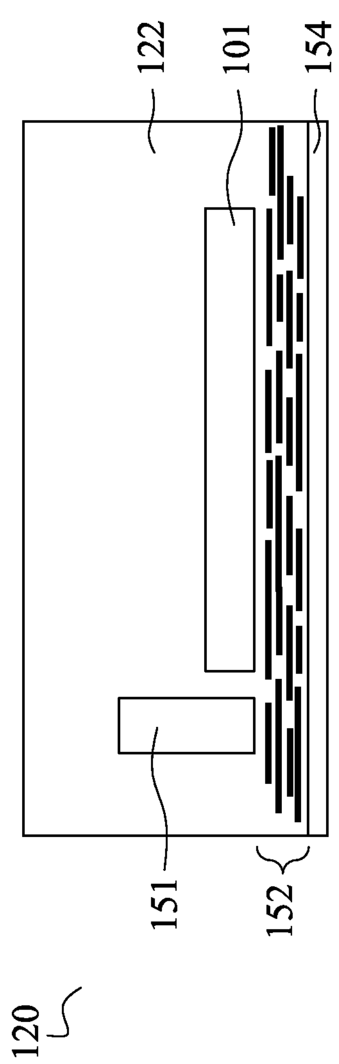

FIG. 33 illustrates the flipping of wafer 120 and the lamination of tape 154 to wafer 120. Tape 154 is used for supporting the backside grinding of wafer 120. Tape 154 may be an Ultra-Violet (UV) curable tape, which may be decomposed under UV light in accordance with some embodiments. The respective process is illustrated as process 508 in the process 500 as shown in FIG. 36.

Figure 34:
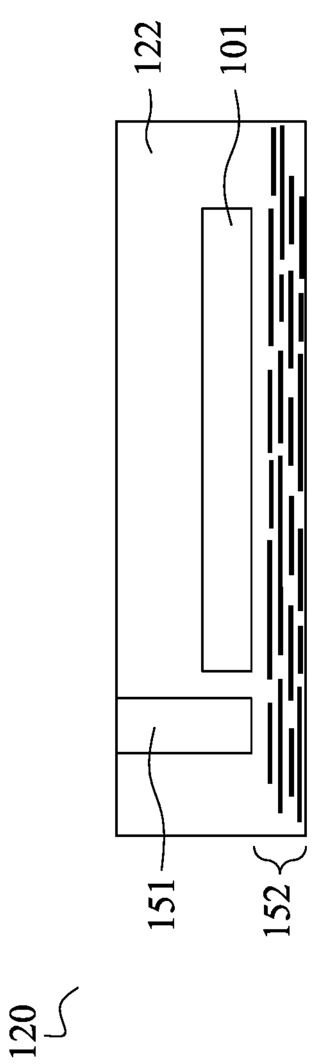

FIG. 34 illustrates the backside grinding process to thin substrate 122, until TSV 151 is exposed. The respective process is illustrated as process 510 in the process 500 as shown in FIG. 36. After the backside grinding process, substrate 122 may have a thickness in the range between about 300 μm and about 400 μm. Tape 154 is removed after the backside grind process. The resulting structure is shown in FIG. 34.

Figure 35:
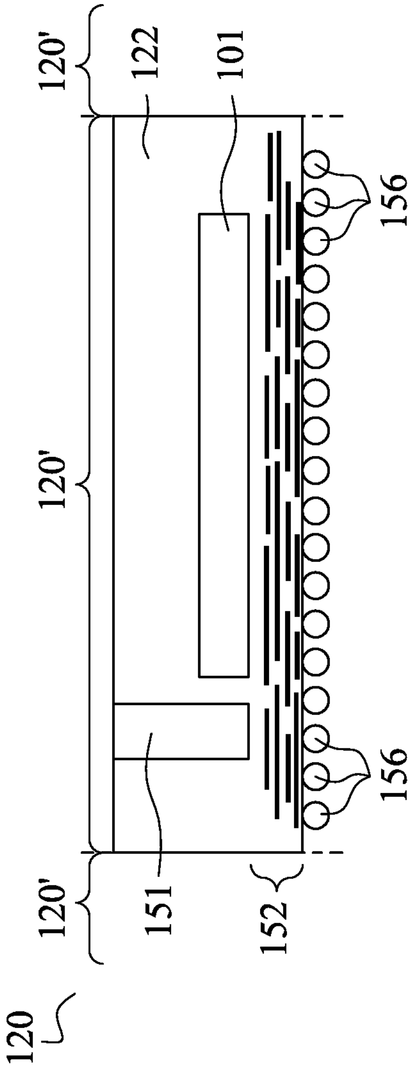
Figure 36:
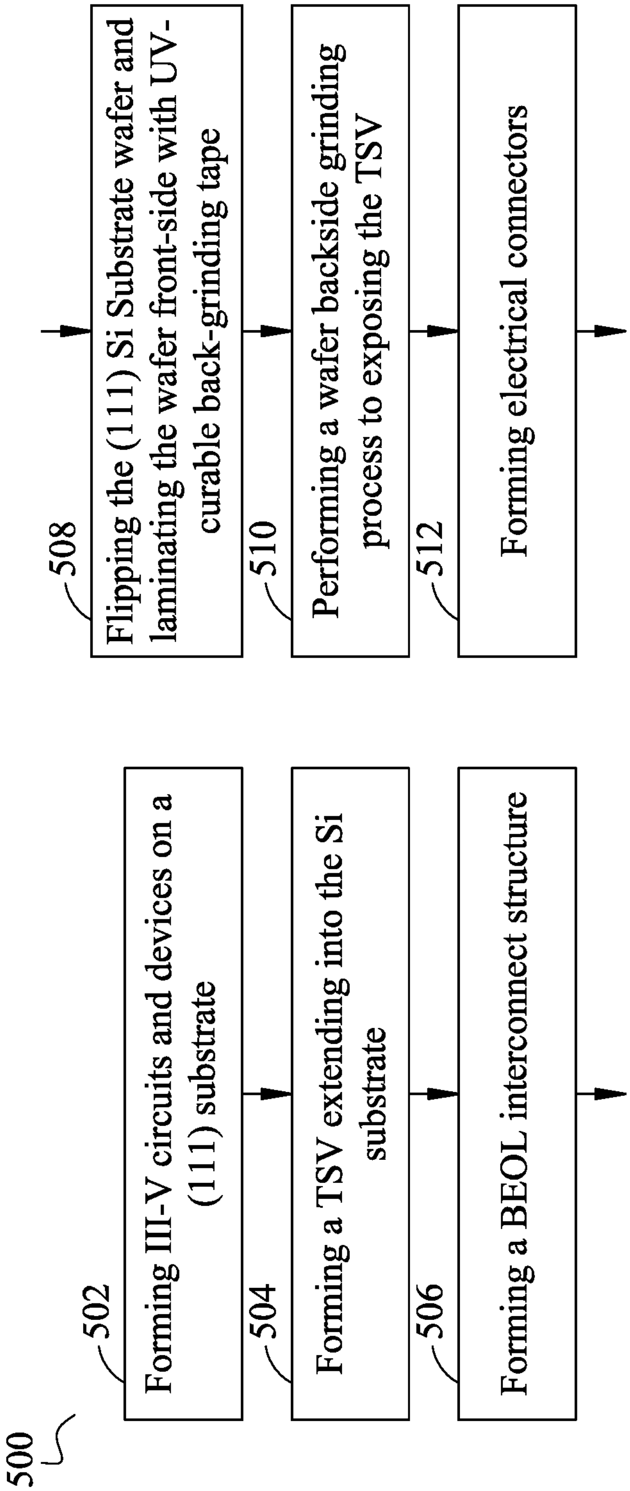
FIG. 36 illustrates a process flow of the processes in FIGS. 30-35 in accordance with some embodiments.

Next, as shown in FIG. 35, electrical connectors 156 are formed to electrically connect to interconnect structure 152. The respective process is illustrated as process 512 in the process 500 as shown in FIG. 36. In accordance with some embodiments, electrical connectors 156 are solder regions. In accordance with alternative embodiments, electrical connectors 156 are micro bumps such as micro copper bumps. In accordance with yet alternative embodiments, the electrical connectors 156 are used for hybrid bonding. In accordance with some embodiments, III-V wafer 120 may be sawed into discrete III-V dies 120', and the discrete dies 120' are used for subsequent bonding and packaging process. In accordance with alternative embodiments, III-V wafer 120 is un-sawed, and is bonded with a CMOS wafer or dies at wafer-level, as will be discussed in subsequent processes.

Figure 43:
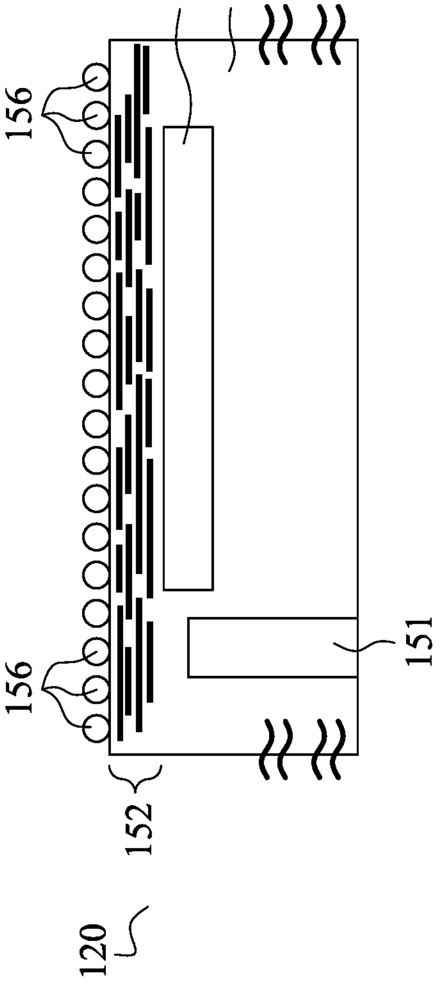
Figure 44:
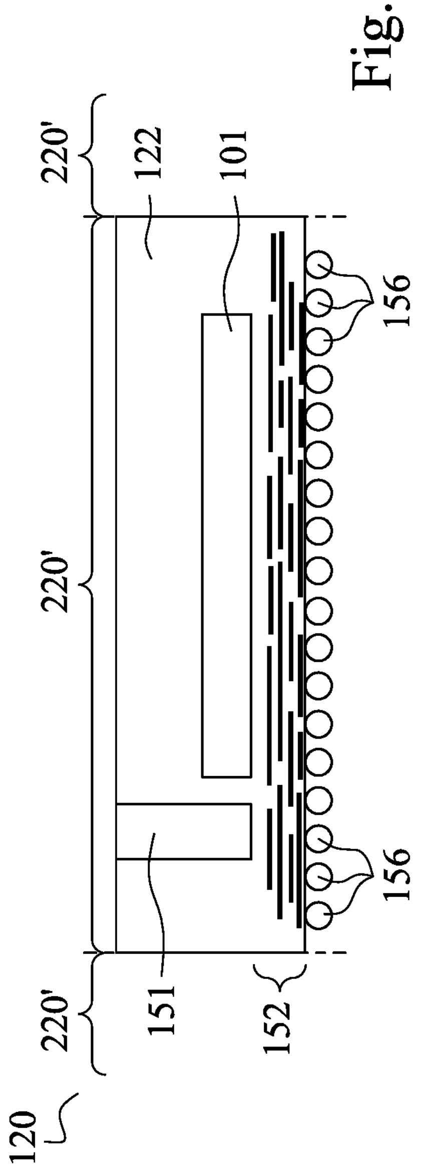
Figure 45:
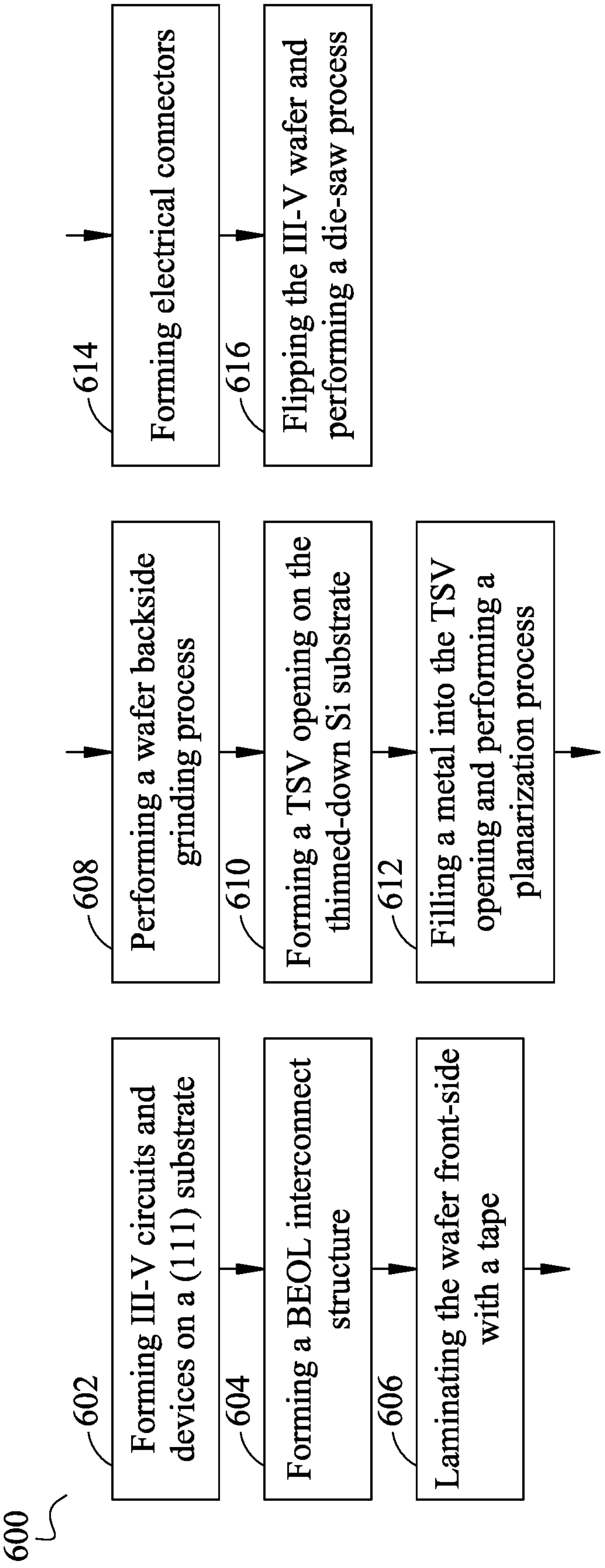
FIG. 45 illustrates a process flow of the processes in FIGS. 37-44 in accordance with some embodiments.

FIGS. 37-44 illustrate the formation of an interconnect structure and electrical connectors for III-V wafer 120 in accordance with alternative embodiments. These embodiments are similar to the embodiments shown in FIGS. 30-36, except that TSVs 151 are formed from the backside of substrate 122. The process flow 600 is shown in FIG. 45. The processes are discussed briefly.

Figure 37:
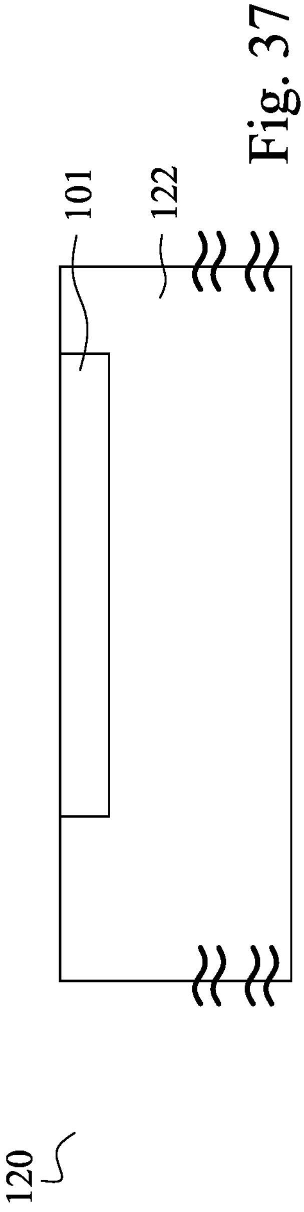
FIGS. 37-44 illustrate the cross-sectional views of intermediate stages in the formation of interconnect structures in a III-V device die/wafer in accordance with some embodiments.
Figure 38:
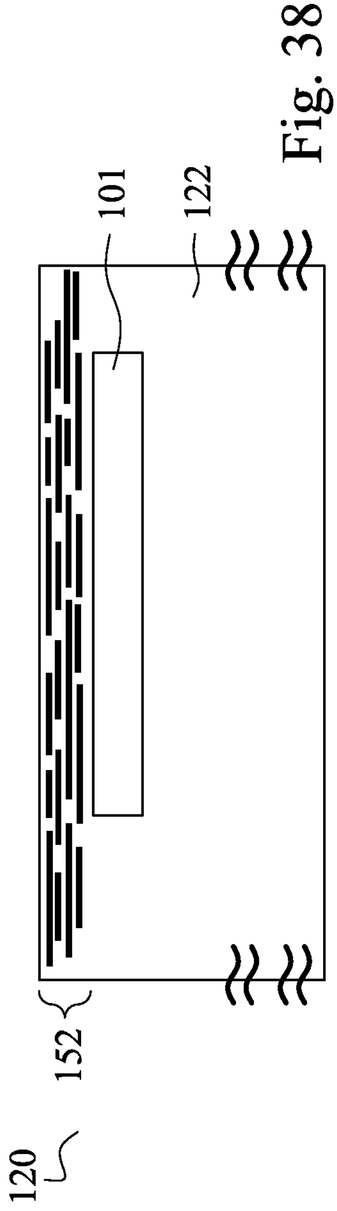
Figure 39:
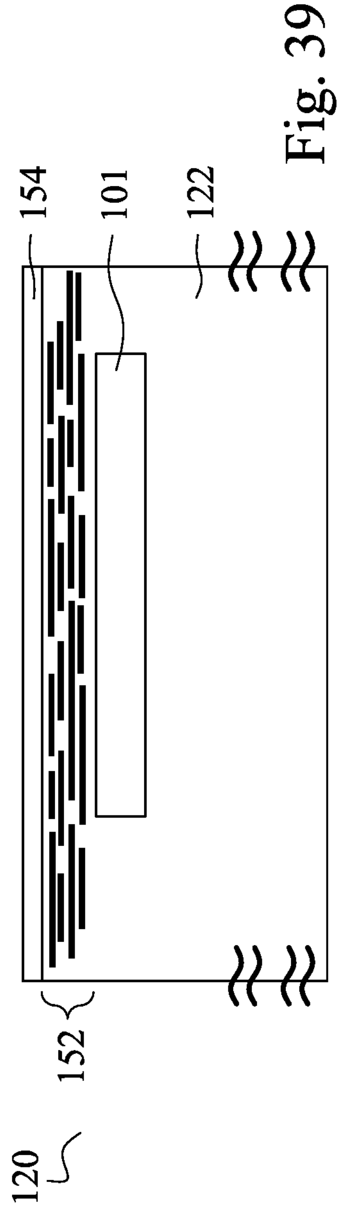
Figure 40:
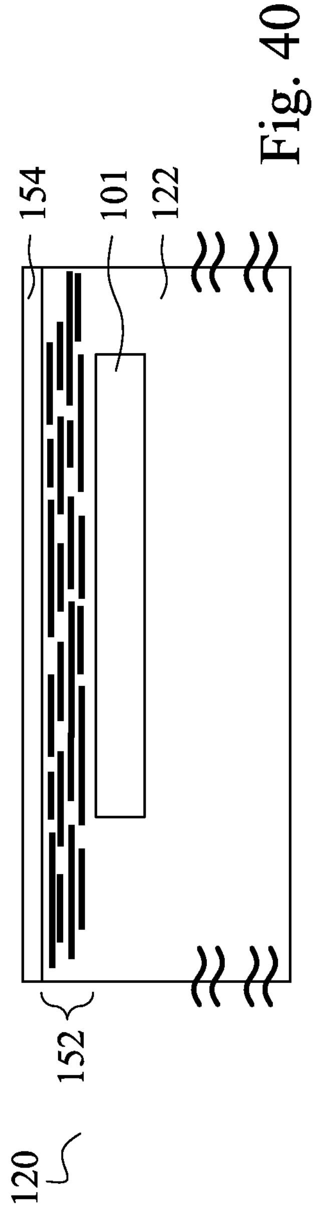

FIG. 37 illustrates the formation of wafer 120 including circuits 101, which formation processes include the processes shown in FIG. 3-15 or 16-29. The respective process is illustrated as process 602 in the process 600 shown in FIG. 45. FIG. 38 illustrates the formation of interconnect structure 152. The respective process is illustrated as process 604 in the process 600 shown in FIG. 45. FIG. 39 illustrates the attachment of tape 154 to the front side of wafer 120. The respective process is illustrated as process 606 in the process 600 shown in FIG. 45. FIG. 40 illustrates the backside grinding of wafer 120. The respective process is illustrated as process 608 in the process 600 shown in FIG. 45. After the backside grinding process, substrate 122 may be thick enough so that no warping and breaking occur to the wafer 120. For example, the thickness may be in the range between about 300 μm and about 400 μm.

Figure 41:
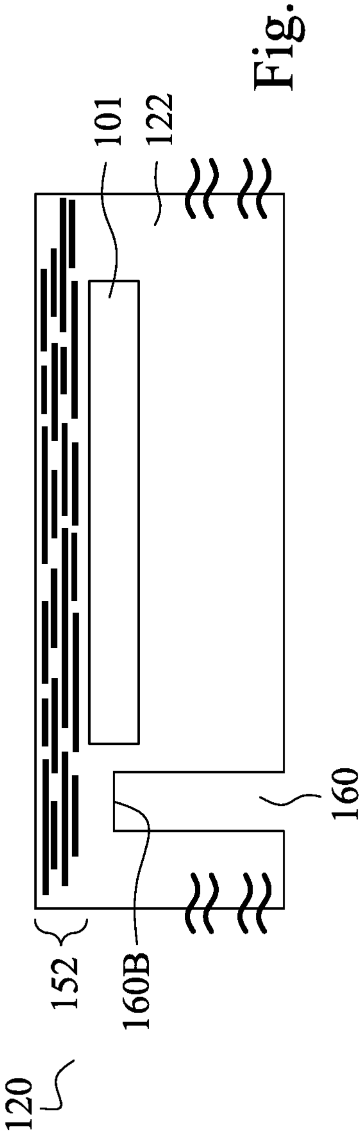
Figure 42:
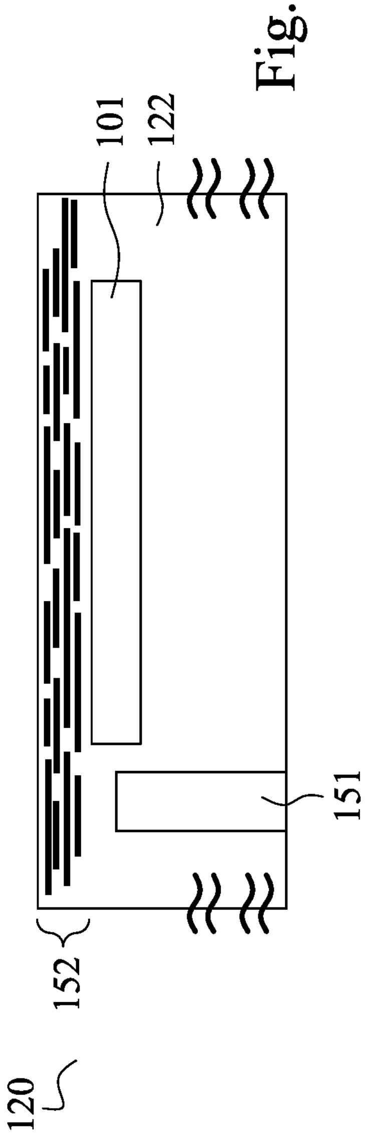

FIG. 41 illustrates the etching of substrate 122, so that TSV opening 160 is formed. The respective process is illustrated as process 610 in the process 600 shown in FIG. 45. In accordance with some embodiments, opening 160 has an end (the top end as in FIG. 41, which actually is the bottom 160B of opening 160 when wafer 120 is flipped upside-down). In accordance with some embodiments, bottom 160B is at an intermediate level between a top surface and a bottom surface of (semiconductor) substrate 122. In accordance with alternative embodiments, one of metal pads in interconnect structure 152 is exposed to TSV opening 160, and the corresponding metal pad in interconnect structure 152 is used as an etch stop layer. FIG. 42 illustrates the formation of TSV 151 in TSV opening 160 by filling a metallic material, followed by a CMP process. The respective process is illustrated as process 612 in the process 600 shown in FIG. 45.

FIG. 43 illustrates the formation of electrical connectors 156. The respective process is illustrated as process 614 in the process 600 shown in FIG. 45. FIG. 44 illustrates the flipping of wafer 120 and a die-saw process (if performed at this time). The respective process is illustrated as process 616 in the process 600 shown in FIG. 45. When sawed, discrete III-V dies 120' are separated from each other. In accordance with alternative embodiments, wafer 120 is not sawed at this time.

Figure 46:
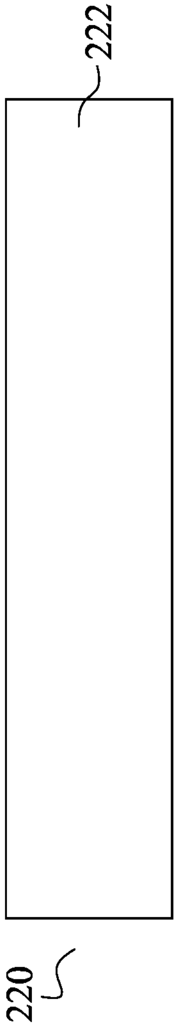
FIGS. 46-52 illustrate the cross-sectional views of intermediate stages in the formation of a CMOS device die/wafer in accordance with some embodiments.

FIGS. 46-52 illustrate the formation of CMOS wafer 220 in accordance with some embodiments. The respective process is illustrated as process 700 in FIG. 49. Referring to FIG. 46, substrate 222 is provided as a part of wafer 220. The respective process is illustrated as process 702 in the process 700 shown in FIG. 53. In accordance with some embodiments, substrate 222 is a semiconductor substrate, which may include a silicon substrate, a silicon germanium substrate, or the like. Substrate 122 may be a bulk substrate formed of a bulk material such as silicon, or may be a composite substrate including a plurality of layers that are formed of different materials. The top surface of substrate 222 is on (100) surface plane of the respective lattice structure, and hence substrate 222 is referred to as a (100) substrate.

Figure 47:
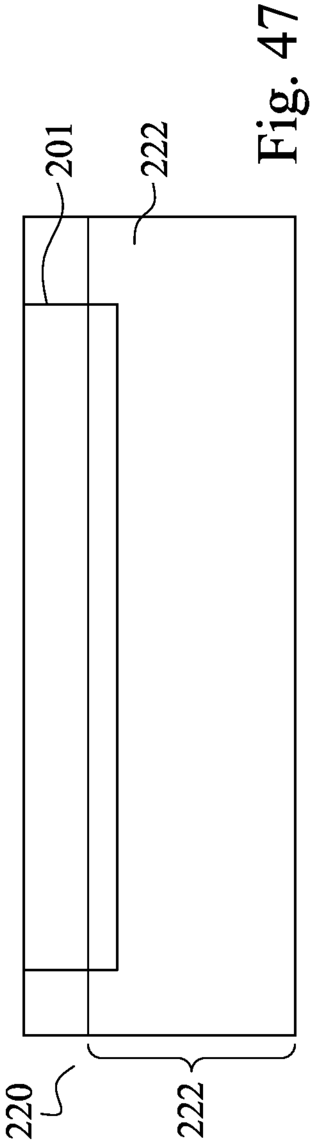

Referring to FIG. 47, circuits 201 are formed at the top surface of substrate 222. The respective process is illustrated as process 704 in the process 700 shown in FIG. 53. The respective circuits 201 may include the circuits as discussed referring to FIG. 1. Furthermore, circuits 201 include logic/core circuits, which include CMOS devices including p-type (PMOS) transistors and n-type (NMOS) transistors, diodes, etc. as schematically shown as transistors 206 in FIG. 2. Circuits 201 may also include analog circuits, digital circuits, or the like, or combinations thereof. Circuits 201 may also include the p-type transistors 203 in circuits 202 as shown in FIG. 2, wherein circuits 202 expand to both of III-V die 120' and CMOS die 220', and may be low-voltage circuits such as controllers. An example circuit 202 may include a functional device such as an inverter, a gate, or the like.

Figure 48:
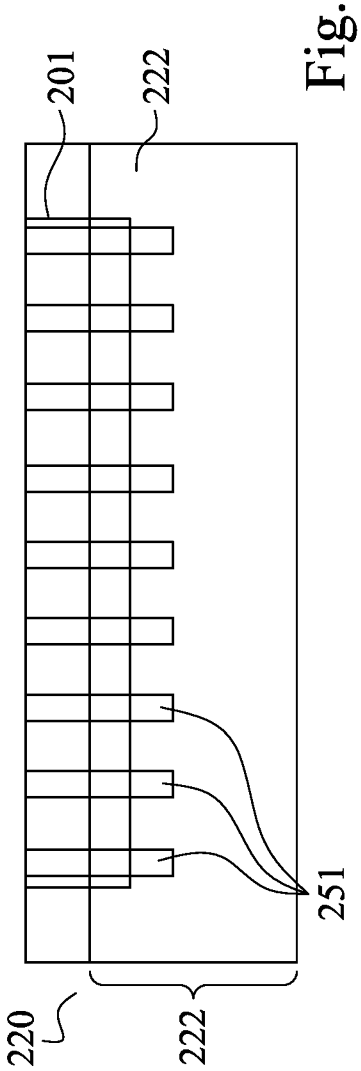

Referring to FIG. 48, TSVs 251 are formed extending from the front surface of substrate 222 into substrate 222. TSVs 251 may be used for connecting to power or electrical ground, and/or may be used for conducting low-frequency electrical signals. The formation processes of TSVs 251 are similar to the formation of TSVs 151 as shown in FIG. 31. The respective process is illustrated as process 706 in the process 700 shown in FIG. 53.

Figure 49:
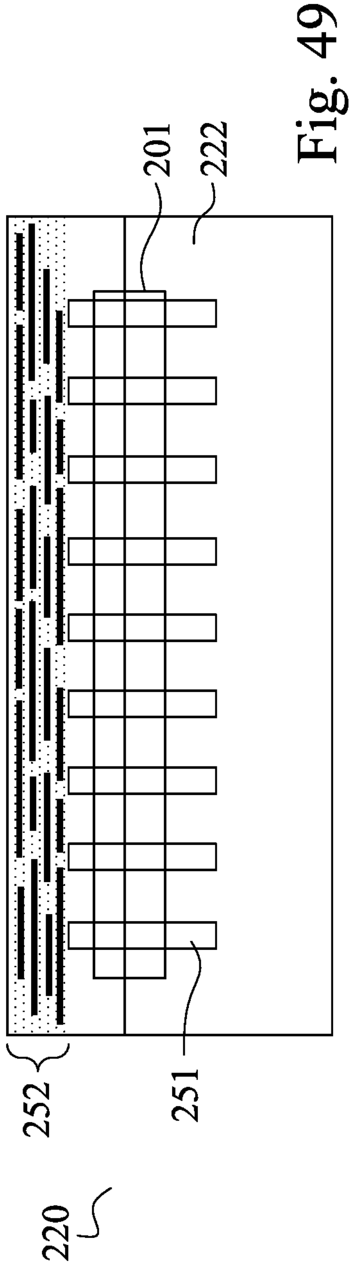
Figure 50:
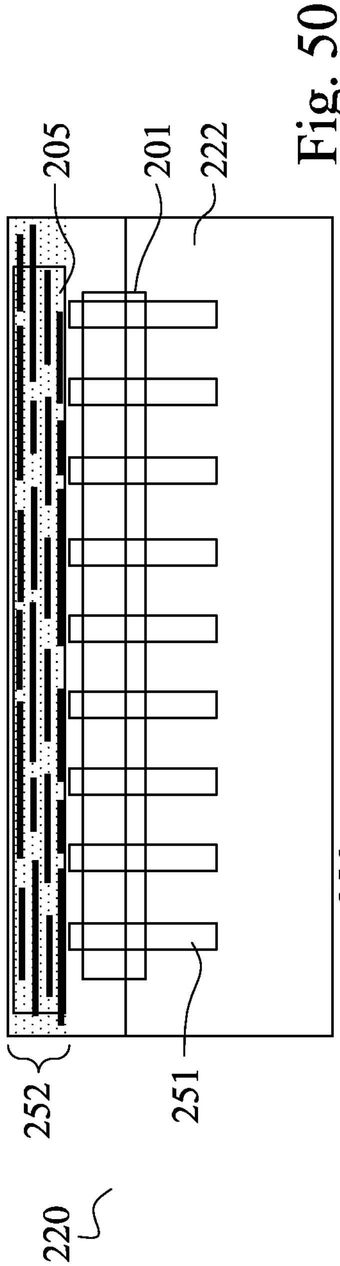

Referring to FIG. 49, interconnect structure 252 is formed at the top surface of substrate 222. The respective process is illustrated as process 708 in the process 700 shown in FIG. 53. Referring to FIG. 50, passive devices 205 are formed. Passive devices 205 may include capacitors, resistors, inductors, diodes, or the like. The respective process is illustrated as process 710 in the process 700 shown in FIG. 53. It is appreciated that although interconnect structure 252 and passive device 205 are shown sequentially in the process flow 700, they may be formed in common processes. The passive devices 205 and the circuits 201 are interconnected to form functional circuits, which may include analog circuits and/or digital circuits.

Figure 51:
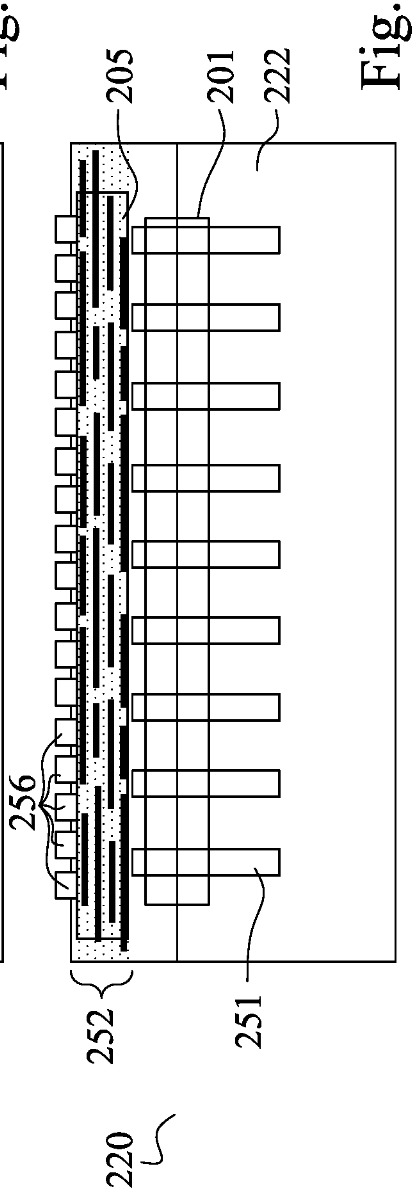
Figure 52:
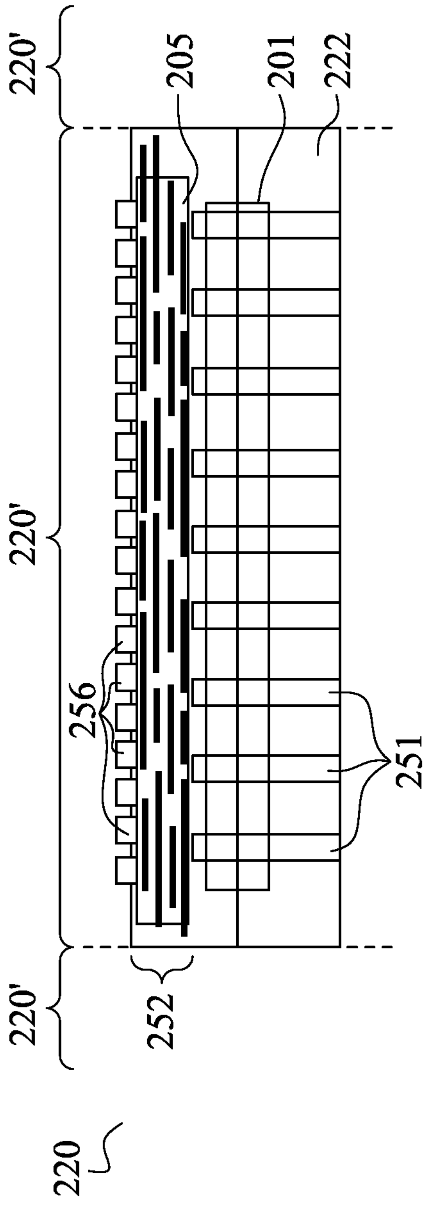
Figure 53:
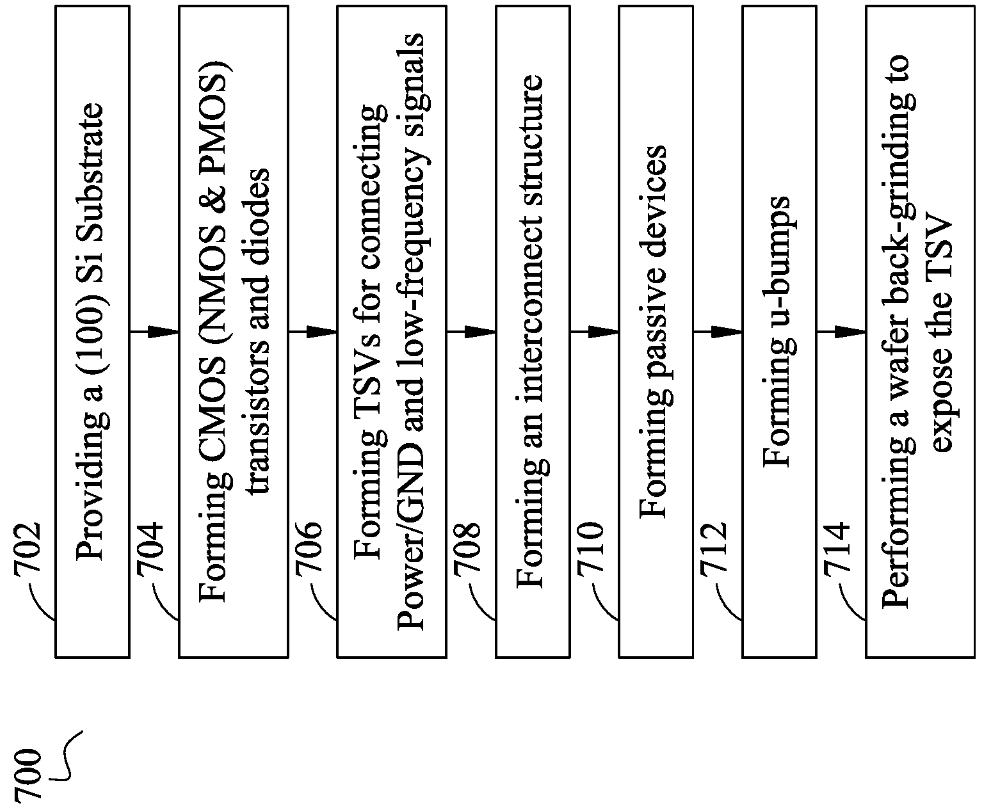
FIG. 53 illustrates a process flow in a bonding process in accordance with some embodiments.

Referring to FIG. 51, electrical connectors 256 are formed at the top surface of substrate 222. The respective process is illustrated as process 712 in the process 700 shown in FIG.

53. Electrical connectors 256 may be solder regions, micro bumps such as micro copper bumps, metal pads, or the like. In a subsequent process, a tape (not shown), which may be a UV tape, may be adhered to the top surface of wafer 220. A backside grinding process is then performed to thin substrate 222, until TSVs 251 are exposed. The respective process is illustrated as process 714 in the process 700 shown in FIG. 53. The resulting wafer 220 is show in FIG. 52. Wafer 220 may be sawed into CMOS dies 220', or remain as a wafer to perform the subsequent bonding with a III-V wafer or III-V dies.

Figure 54:
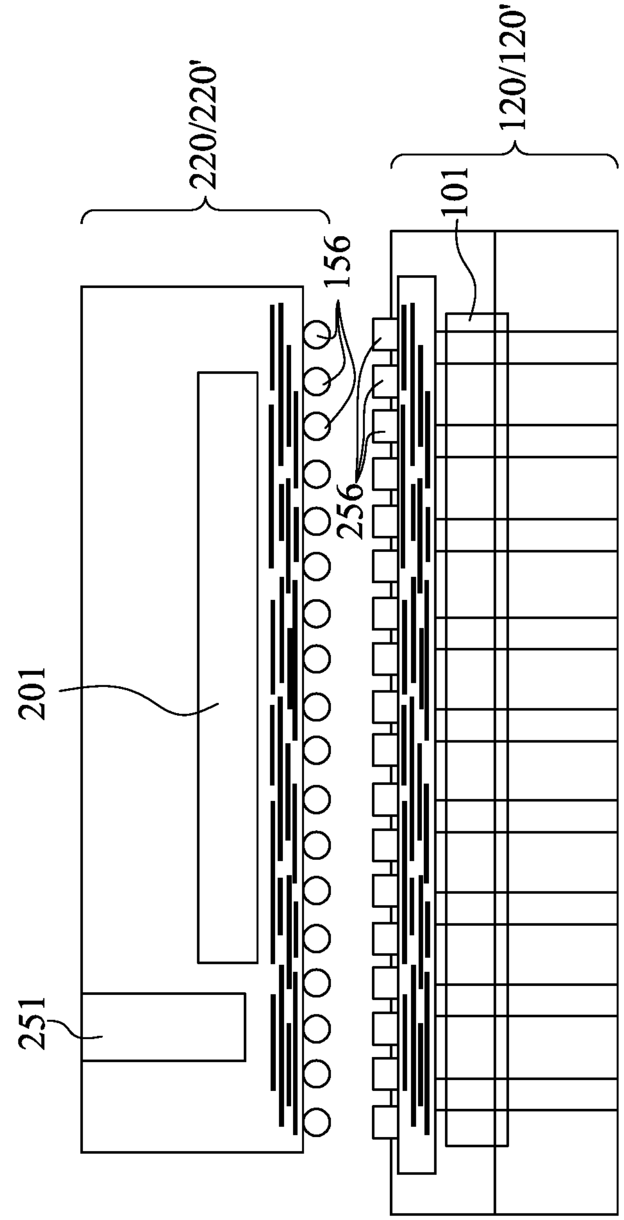
FIGS. 54-57 illustrate the cross-sectional views of intermediate stages in a bonding process in accordance with some embodiments.
Figure 59:
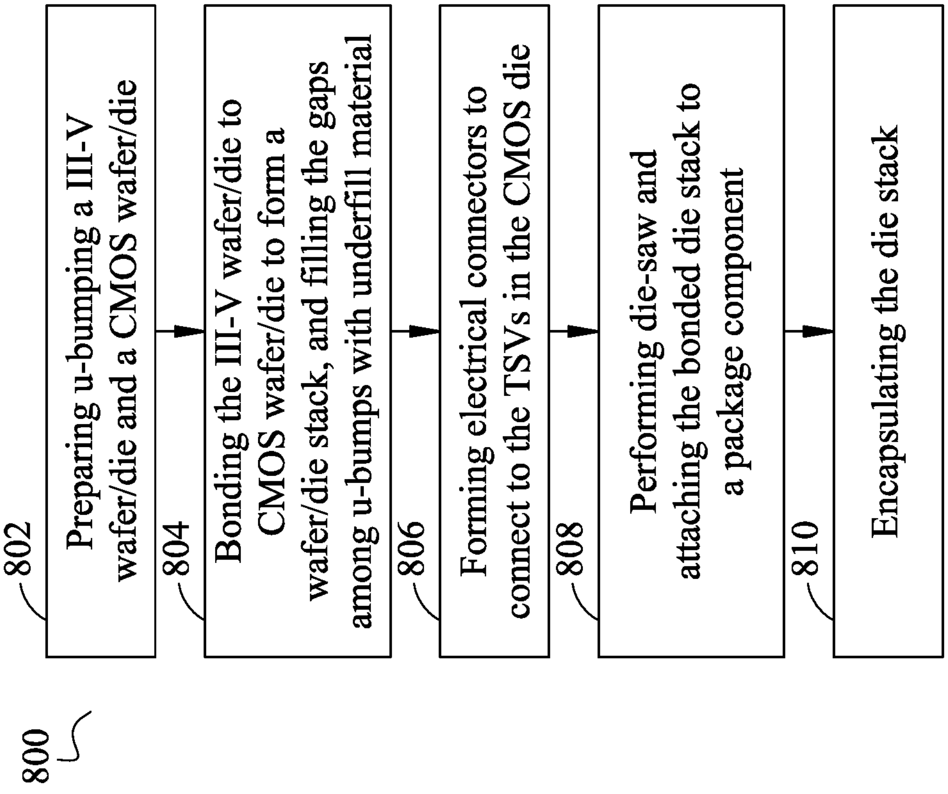
FIG. 59 illustrates a process flow of the processes shown in FIGS. 54-57 in accordance with some embodiments.

FIGS. 54-57 illustrate the bonding of a III-V wafer/dies with a CMOS wafer/dies, and the corresponding packaging process. The respective process flow 800 is shown in FIG. 59. Referring to FIG. 54, a III-V die 120' and a CMOS die 220' are prepared, which include a cleaning process to remove oxides from electrical connectors 156 and 256. The respective process is illustrated as process 802 in the process 800 shown in FIG. 59. It is appreciated that the bonding process may be performed at die level or wafer. If at wafer, the illustrated dies are parts of an un-sawed wafer(s).

Figure 55:
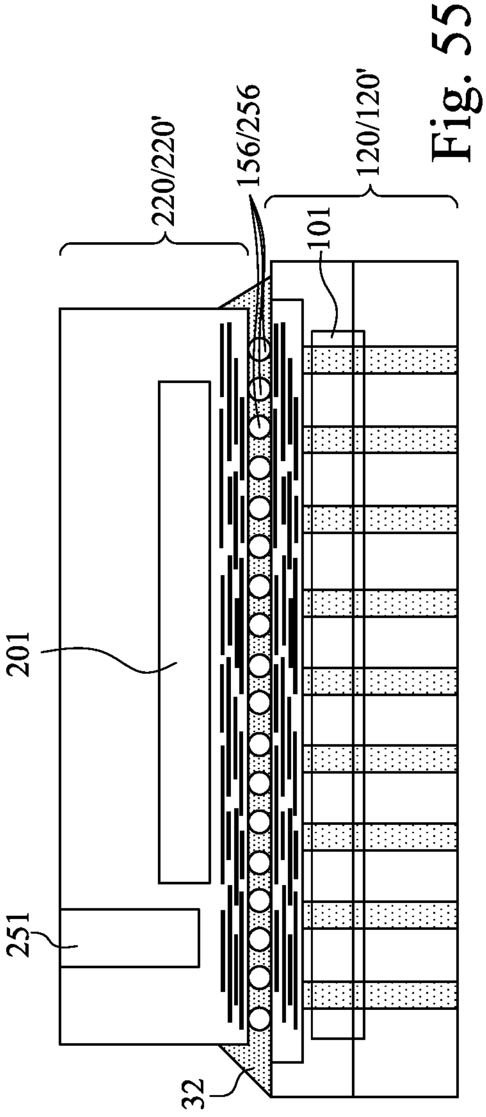
Figure 56:
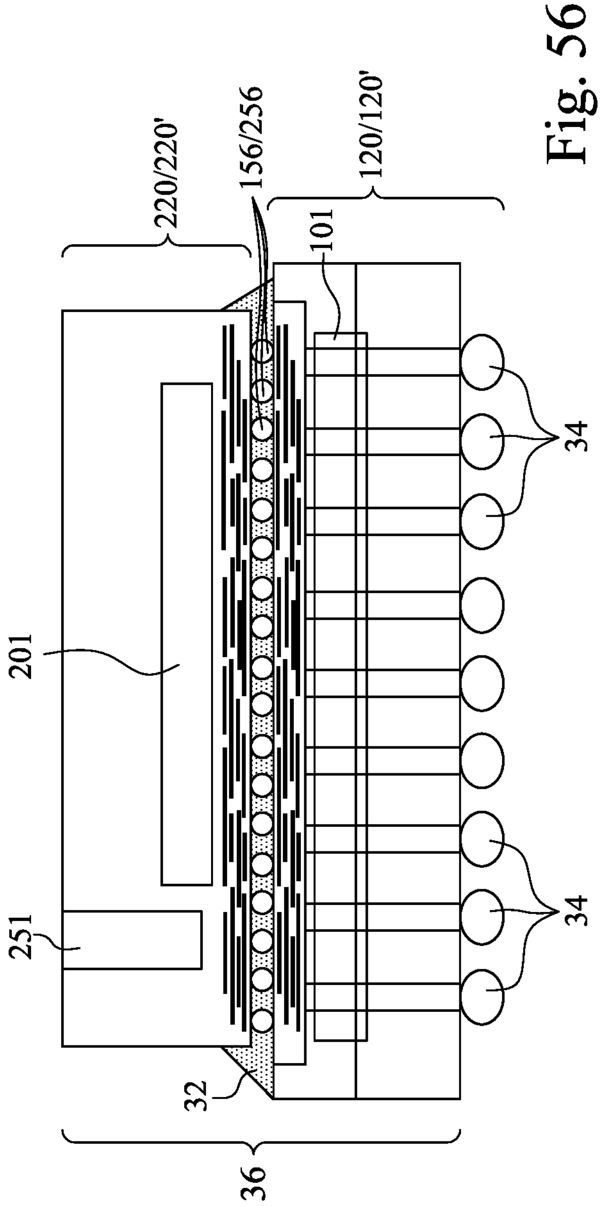

Next, as shown in FIG. 55, III-V die 120' is bonded to CMOS die 220'. The bonding may include solder bonding, direct metal-to-metal bonding, or the like. An underfill 32 may then be filled into the gap between III-V die 120' and CMOS die 220'. The respective process is illustrated as process 804 in the process 800 shown in FIG. 59. FIG. 56 illustrates the formation of electrical connectors 34, which are electrically connect to, and may or may not physically join, TSVs 251. The respective process is illustrated as process 806 in the process 800 shown in FIG. 59. Electrical connectors 34 may be solder regions, metal pillars, metal pads, or the like. Die stack 36 is thus formed.

Figure 57:
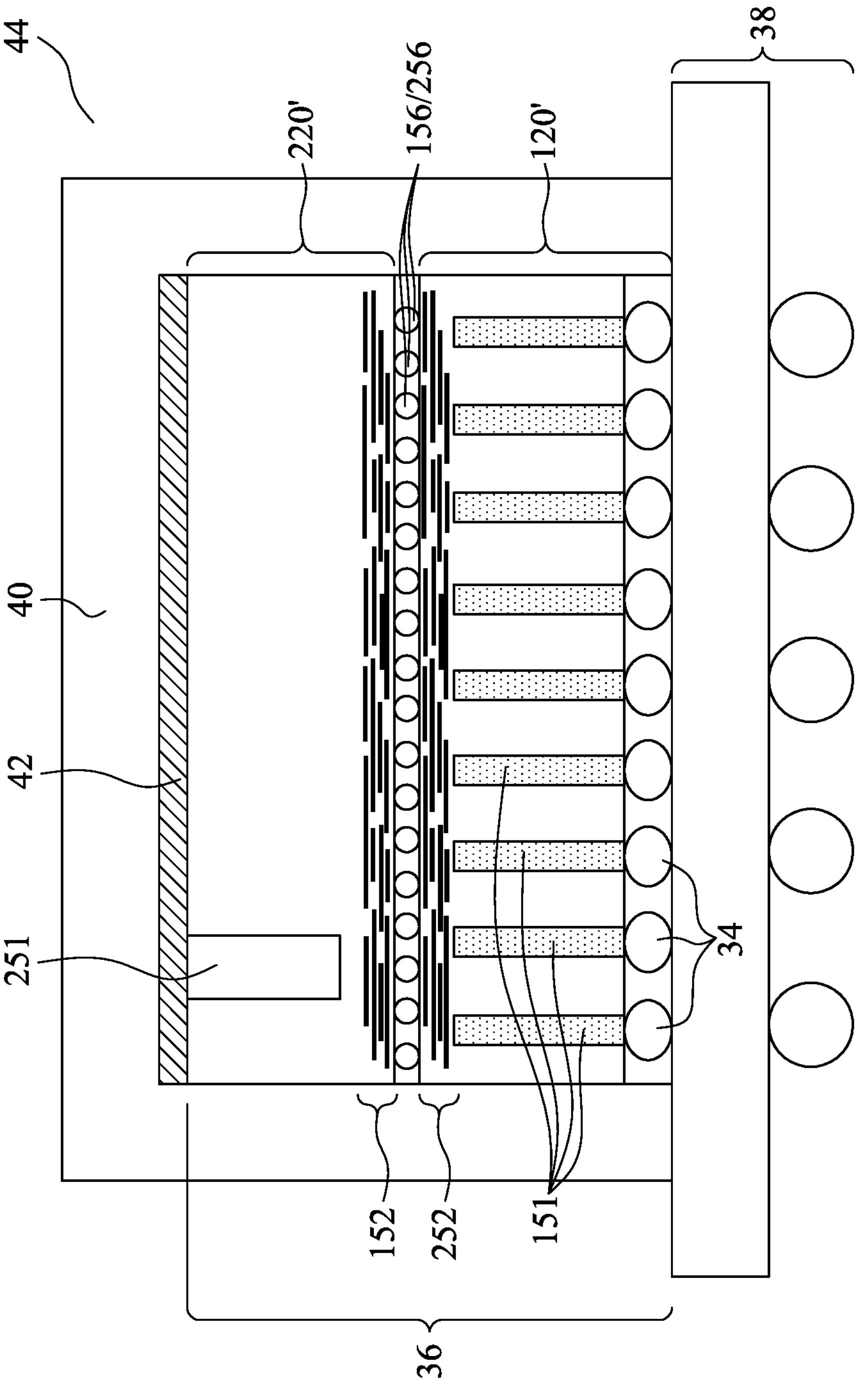

If the bonded die stack are inside un-sawed wafer(s), a sawing process may be performed to separate the III-V dies 120' and CMOS dies 220' to form discrete die stacks 36. A die stack 36 is then bonded to a package component 38, and the resulting structure is shown in FIG. 57. The respective process is illustrated as process 808 in the process 800 shown in FIG. 59. In accordance with some embodiments, package component 38 is or comprises a package substrate, an interposer, a printed circuit board, a package including device die(s), or the like.

Further referring to FIG. 57, heat sink 40 is attached to die stack 36, for example, through Thermal Interface Material (TIM) 42. TIM 42 is an adhesive that has a high thermal conductivity, for example, higher than about 1 watt/(k*m), 5 watt/(k*m), or higher. Heat sink 40 may be formed of or comprise a metal such as copper, stainless steel, or the like. Accordingly, the heat generated in die stack 36 during its operation may be conducted through TSV 251 to heat sink 40 through TIM 42. TSVs 151 may be used to connect to power, electrical ground, or signals. Package 44 is thus formed. The respective process is illustrated as process 810 in the process 800 shown in FIG. 59.

Figure 58:
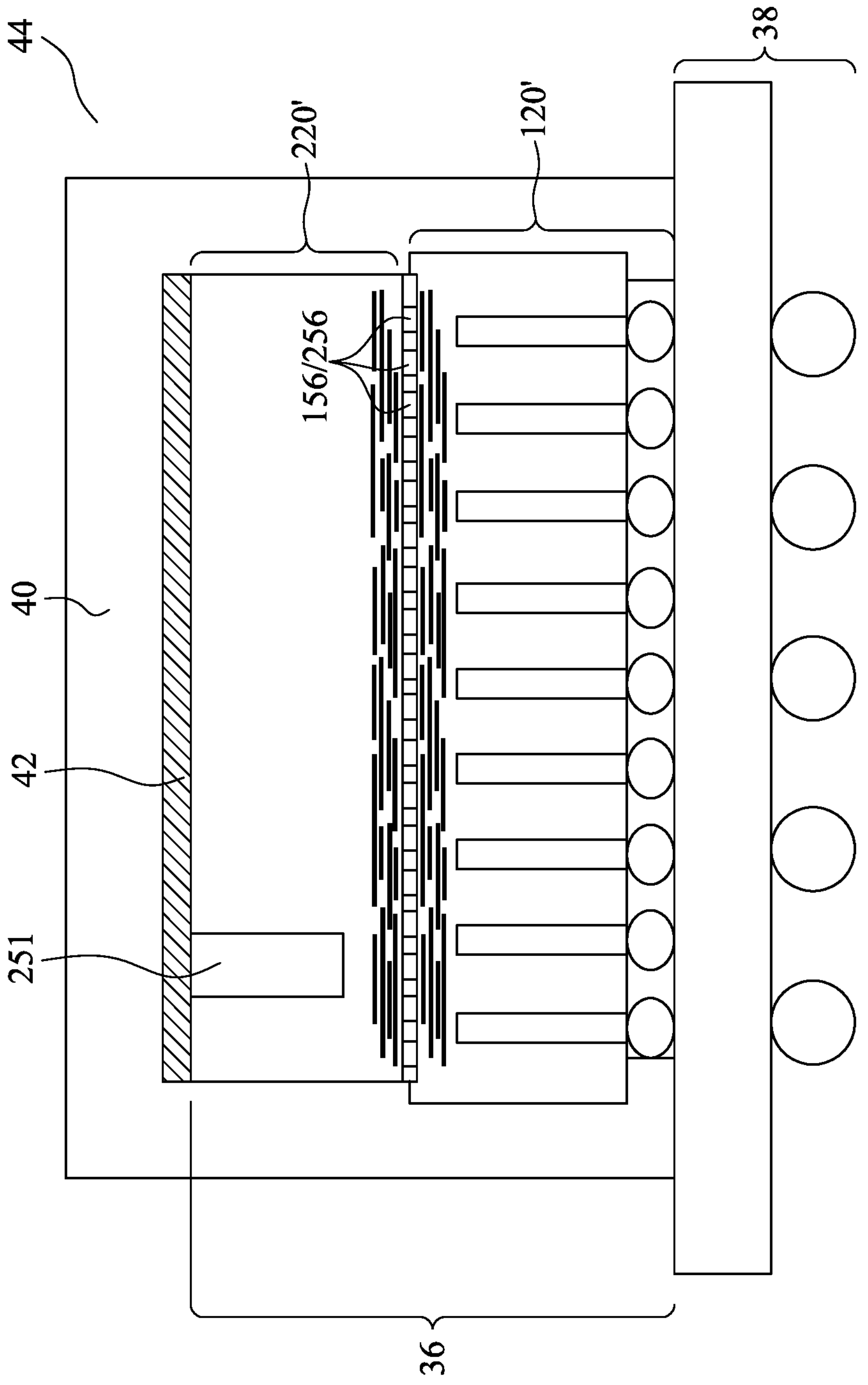
FIG. 58 illustrates a cross-sectional view of a package formed through a hybrid bonding process in accordance with some embodiments.

FIG. 58 illustrates package 44 in accordance with alternative embodiments. These embodiments are similar to the embodiments in FIG. 57, except that in FIG. 57, the bonding of III-V die 120' to CMOS die 220' is through U-bumps or solder regions, while in FIG. 58, the bonding of III-V die 120' to CMOS die 220' is through hybrid bonding. In the hybrid bonding, a surface dielectric layer in III-V die 120' is bonded to a surface dielectric layer in CMOS die 220' through fusion bonding (with Si—O—Si bonds formed). Furthermore, the bond pads 156 in III-V die 120' are bonded to bond pads 256 in CMOS die 220' through direct metal-to-metal bonding, wherein metal inter-diffusion occurs to join bond pads 156 to bond pads 256.

Figure 60:
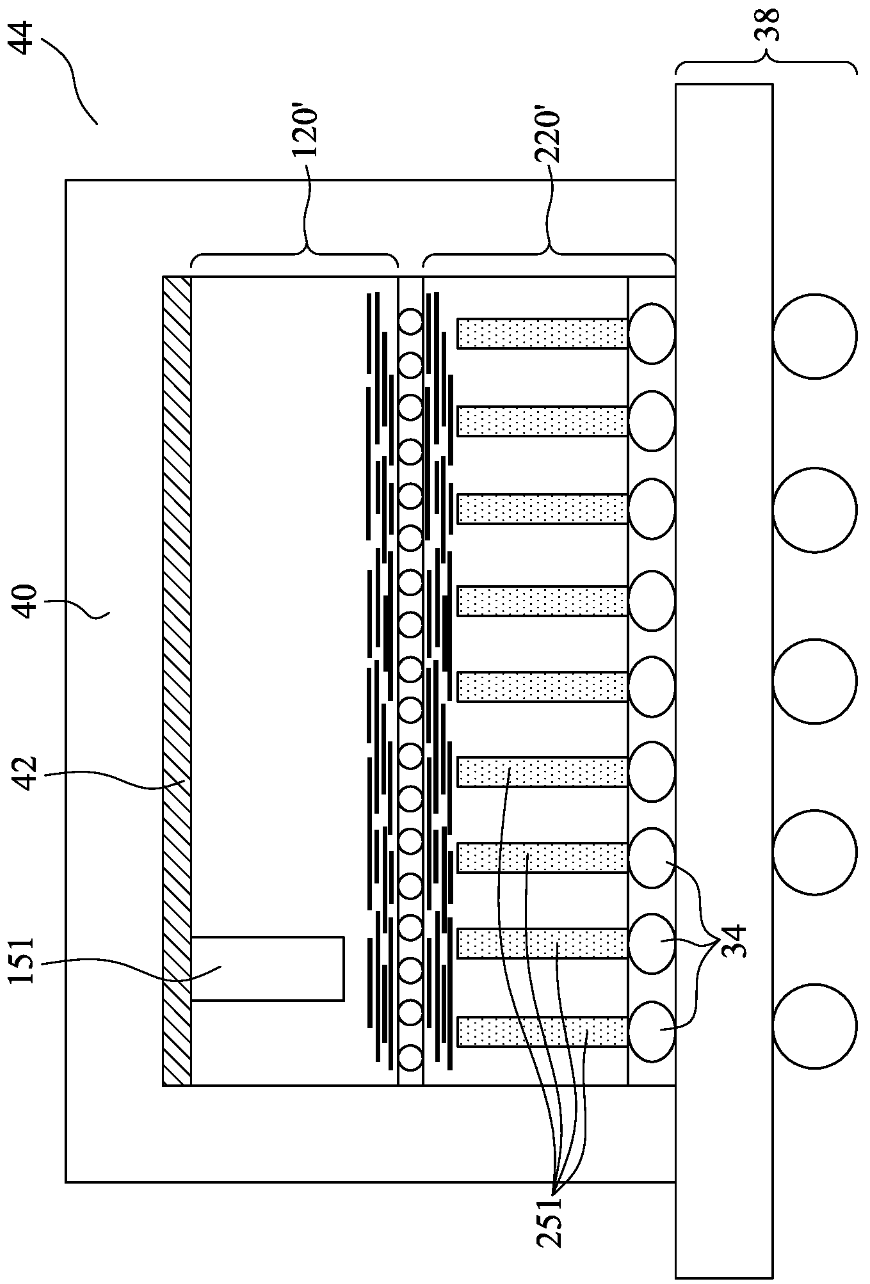
FIGS. 60-63 illustrate cross-sectional views of some packages in accordance with some embodiments.

FIG. 60 illustrates package 44 formed in accordance with alternative embodiments. These embodiments are similar to the embodiments shown in FIG. 57, except that CMOS die 220', instead of being overlying, is underlying, III-V die 120'.

Figure 61:
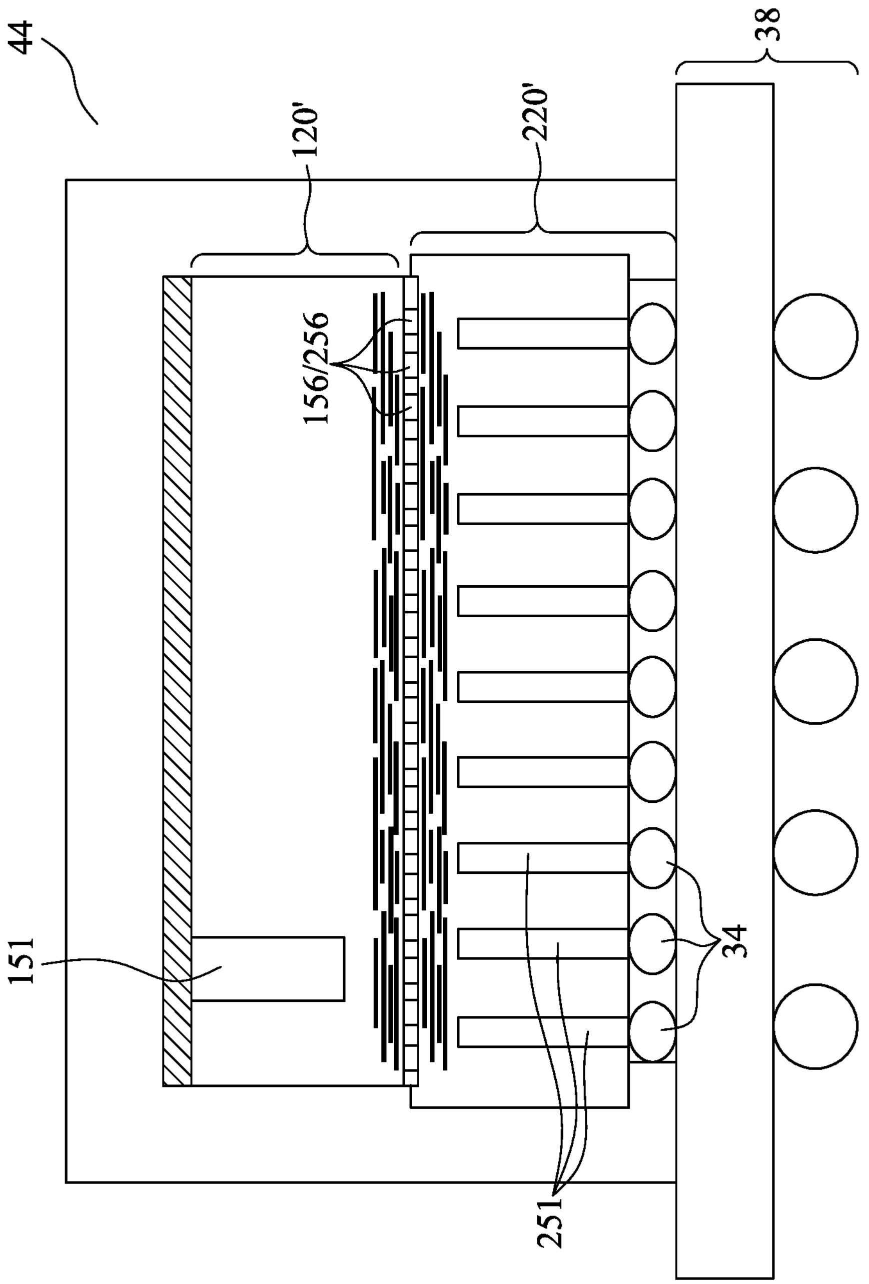

FIG. 61 illustrates package 44 formed in accordance with alternative embodiments. These embodiments are similar to the embodiments shown in FIG. 60, except that hybrid bonding, rather than solder bonding or micro bump bonding, is performed.

Figure 62:
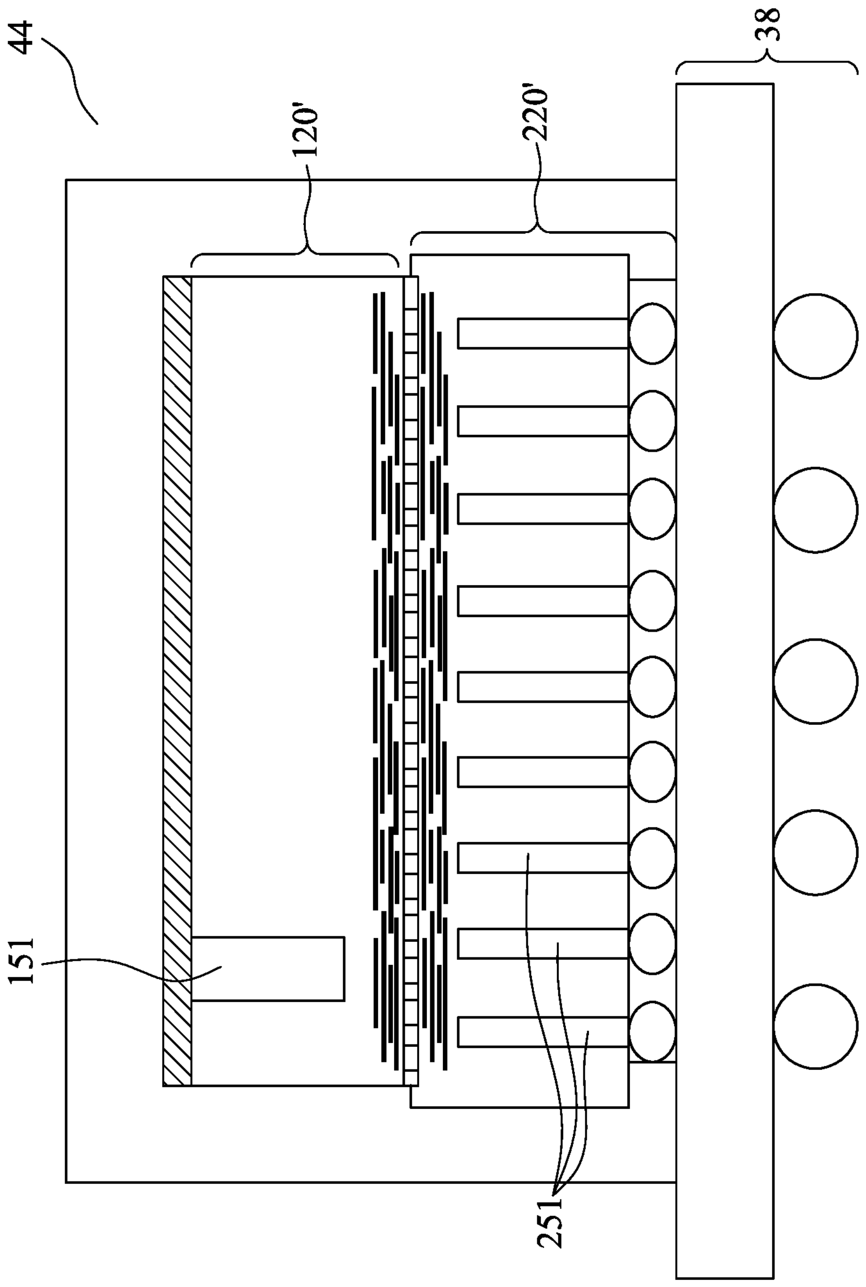

FIG. 62 illustrates package 44 formed in accordance with alternative embodiments. These embodiments are similar to the embodiments shown in FIG. 58, except that in III-V die 120', the III-V materials may include other materials other than what are disclosed in the embodiments shown in FIGS. 3-29.

Figure 63:
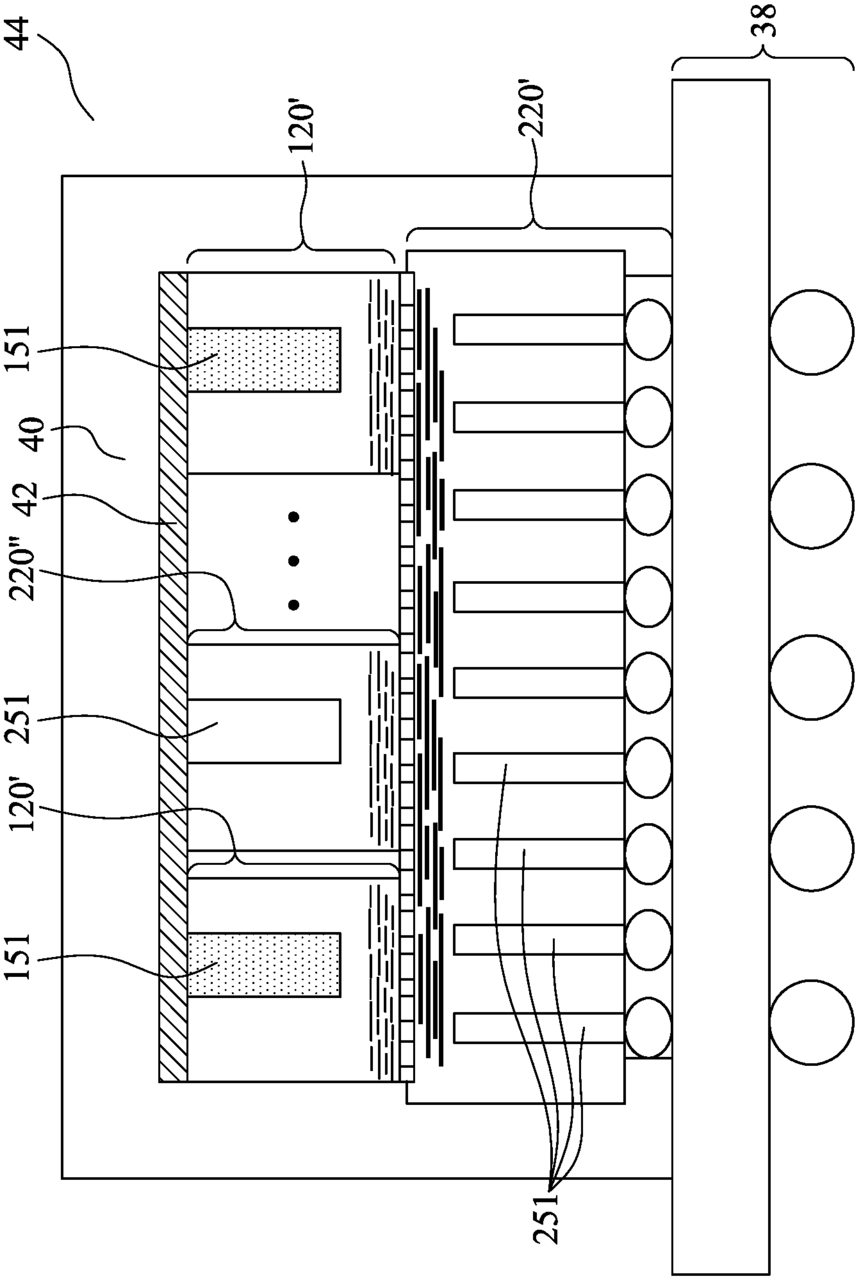

FIG. 63 illustrates package 44 formed in accordance with alternative embodiments. These embodiments are similar to the embodiments shown in FIG. 58, except that there are a plurality of dies overlying and bonding to CMOS die 220'. The plurality of dies may include III-V die 120' and additional CMOS dies 220".

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming high-voltage devices and high-power devices as III-V-based devices and on a (111) substrate, the performance of the high voltage/power devices is improved. By forming low-voltage core/logic devices on a (100) substrate, the performance of the low-voltage core/logic devices is also improved. By stacking the III-V die and the CMOS die, the lengths of the electrical paths for interconnecting the devices in the III-V die and the CMOS die are reduced, and the latency is reduced. This improves the high-power efficiency for some application such as power amplifiers, while maintains the low parasitic capacitance and high density of the CMOS circuits. The embodiments have improved performance over conventional structures, in which a III-V die and a CMOS die may be bonded side-by-side to an underlying package substrate, and inter-communicate through the package substrate. In which case, the signal paths are long.

In accordance with some embodiments of the present disclosure, a method includes bonding a III-V die directly to a CMOS die to form a die stack, wherein the III-V die comprises a (111) semiconductor substrate; and a first circuit comprising a III-V based n-type transistor formed at a surface of the (111) semiconductor substrate, and wherein the CMOS die comprises a (100) semiconductor substrate; a second circuit comprising an n-type transistor on the (100) semiconductor substrate; and a p-type transistor on the (100)

semiconductor substrate, wherein the first circuit is electrically connected to the second circuit.

In an embodiment, the III-V die is over the CMOS die, and the method further comprises forming a through-via in the III-V die; polishing the (111) semiconductor substrate to reveal the through-via; and attaching a heat sink to the III-V die through a thermal interface material, wherein the thermal interface material physically contacts the through-via. In an embodiment, the CMOS die is over the III-V die, and the method further comprises forming a through-via in the CMOS die; polishing the (100) semiconductor substrate to reveal the through-via; and attaching a heat sink to the CMOS die through a thermal interface material, wherein the thermal interface material physically contacts the through-via.

In an embodiment, the III-V die is bonded to the CMOS die through solder bonding or micro bump bonding, and wherein the method further comprises dispensing an underfill into a gap between the III-V die and the CMOS die. In an embodiment, the III-V die and the CMOS die are bonded through hybrid bonding. In an embodiment, the III-V die is free from p-type transistors. In an embodiment, the III-V based n-type transistor is directly connected to an additional p-type transistor in the CMOS die to form a functional circuit. In an embodiment, the III-V based n-type transistor in the III-V die is directly connected to the additional p-type transistor in the CMOS die to form an inverter. In an embodiment, the III-V based n-type transistor uses Two-Dimensional Electron Gas (2DEG) as a channel.

In accordance with some embodiments of the present disclosure, a package includes a III-V die comprising a (111) semiconductor substrate; and a III-V based n-type transistor at a surface of the (111) semiconductor substrate; and a CMOS die physically bonding to the III-V die, the CMOS die comprising a (100) semiconductor substrate; an n-type transistor on the (100) semiconductor substrate; and a p-type transistor on the (100) semiconductor substrate. In an embodiment, the III-V die is over the CMOS die, and the package further comprises a through-via in the III-V die; a thermal interface material over and physically contacting the through-via; and a heat sink over and joined to the thermal interface material. In an embodiment, the CMOS die is over the III-V die, and the package further comprises a through-via in the CMOS die; a thermal interface material over and physically contacting the through-via; and a heat sink over and joined to the thermal interface material.

In an embodiment, the package further comprises a underfill between, and in physical contact with, the III-V die and the CMOS die. In an embodiment, the III-V die and the CMOS die are bonded through hybrid bonding. In an embodiment, the III-V die is free from p-type transistors. In an embodiment, the CMOS die comprises an additional p-type transistor, and wherein the III-V based n-type transistor is directly connected to the additional p-type transistor. In an embodiment, the III-V based n-type transistor in the III-V die is directly connected to an additional p-type transistor in the CMOS die to form an inverter.

In accordance with some embodiments of the present disclosure, a package includes a III-V die comprising a (111) semiconductor substrate; a III-V based n-type transistor formed at a surface of the (111) semiconductor substrate; and a first electrical connector connected to the III-V based n-type transistor; and a CMOS die directly bonding to the III-V die, the CMOS die comprising a (100) semiconductor substrate; a p-type transistor at a surface of the (100) semiconductor substrate; and a second electrical connector connecting to the p-type transistor, wherein the first electrical connector and the second electrical connector interconnect the III-V based n-type transistor and the p-type transistor. In an embodiment, the III-V based n-type transistor and the p-type transistor are directly interconnected to form a functional circuit. In an embodiment, the III-V based n-type transistor and the p-type transistor form an inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

bonding a III-V die directly to a Complementary Metal-Oxide-Semiconductor (CMOS) die through solder bonding or micro bump bonding to form a die stack, wherein the III-V die comprises:
  a (111) semiconductor substrate; and
  a first circuit comprising:
    a III-V based n-type transistor formed at a surface of the (111) semiconductor substrate, and wherein the CMOS die comprises:
  a (100) semiconductor substrate;
  a second circuit comprising:
    an n-type transistor on the (100) semiconductor substrate; and
    a p-type transistor on the (100) semiconductor substrate, wherein the first circuit is electrically connected to the second circuit;
dispensing an underfill into a gap between the III-V die and the CMOS die;
forming a through-via in the III-V die;
polishing the (111) semiconductor substrate to reveal the through-via; and
attaching a heat sink to the III-V die through a thermal interface material, wherein the thermal interface material physically contacts the through-via.

2. The method of claim 1, wherein the CMOS die is over the III-V die, and the method further comprises:

forming a through-via in the CMOS die;
polishing the (100) semiconductor substrate to reveal the through-via; and
attaching a heat sink to the CMOS die through a thermal interface material, wherein the thermal interface material physically contacts the through-via.

3. The method of claim 1, wherein the III-V die is free from p-type transistors.

4. The method of claim 1, wherein the III-V based n-type transistor is directly connected to an additional p-type transistor in the CMOS die to form a functional circuit.

5. The method of claim 4, wherein the III-V based n-type transistor in the III-V die is directly connected to the additional p-type transistor in the CMOS die to form an inverter.

6. The method of claim 1, wherein the III-V based n-type transistor uses Two-Dimensional Electron Gas (2DEG) as a channel.

7. The method of claim 1, wherein a first major surface of the (111) semiconductor substrate is on a (111) plane of the (111) semiconductor substrate, and a second major surface of the (100) semiconductor substrate is on a (100) plane of the (111) semiconductor substrate.

8. The method of claim 1, wherein the (111) semiconductor substrate is a silicon substrate, and wherein the III-V based n-type transistor is formed on the silicon substrate.

9. The method of claim 1, wherein the III-V die is bonded to the CMOS die through solder bonding.

10. The method of claim 1, wherein the III-V die is bonded to the CMOS die through micro bump bonding.

11. A method comprising:
- forming a III-V die comprising:
  - forming a III-V based n-type transistor at a surface of a (111) semiconductor substrate;
- forming a Complementary Metal-Oxide-Semiconductor (CMOS) die comprising:
  - forming an n-type transistor on a (100) semiconductor substrate; and
  - forming a p-type transistor on the (100) semiconductor substrate;
- bonding the CMOS die to, and over, the III-V die through hybrid bonding;
- forming a through-via in the III-V die;
- forming a thermal interface material over and physically contacting the through-via; and
- attaching a heat sink over and joined to the thermal interface material.

12. The method of claim 11 further comprising dispensing an underfill between, and in physical contact with, the III-V die and the CMOS die.

13. The method of claim 11, wherein the III-V die is free from p-type transistors.

14. The method of claim 11, wherein the forming the CMOS die comprises forming an additional p-type transistor, and wherein the III-V based n-type transistor is directly connected to the additional p-type transistor.

15. The method of claim 11, wherein the III-V based n-type transistor in the III-V die is directly connected to an additional p-type transistor in the CMOS die to form an inverter.

16. The method of claim 11, wherein a first major surface of the (111) semiconductor substrate is on a (111) plane of the (111) semiconductor substrate, and a second major surface of the (100) semiconductor substrate is on a (100) plane of the (111) semiconductor substrate.

17. The method of claim 11, wherein the (111) semiconductor substrate is a silicon substrate, and wherein the III-V based n-type transistor is formed over the silicon substrate.

18. A method comprising:
- forming a III-V die comprising:
  - forming a III-V based n-type transistor at a surface of a (111) semiconductor substrate; and
  - forming a first electrical connector connected to the III-V based n-type transistor;
- forming a Complementary Metal-Oxide-Semiconductor (CMOS) die comprising:
  - forming a p-type transistor at a surface of a (100) semiconductor substrate; and
  - forming a second electrical connector connecting to the p-type transistor, wherein the first electrical connector and the second electrical connector interconnect the III-V based n-type transistor and the p-type transistor; and
- bonding the CMOS die directly to the III-V die, wherein the III-V based n-type transistor and the p-type transistor form an inverter, and wherein the III-V based n-type transistor and the p-type transistor are directly interconnected to form a functional circuit.

19. The method of claim 18, wherein the III-V die is free from p-type transistors.

20. The method of claim 18, wherein a first major surface of the (111) semiconductor substrate is on a (111) plane of the (111) semiconductor substrate, and a second major surface of the (100) semiconductor substrate is on a (100) plane of the (111) semiconductor substrate.

* * * * *